United States Patent
Sakuta et al.

(10) Patent No.: US 9,070,843 B2
(45) Date of Patent: Jun. 30, 2015

(54) SEMICONDUCTOR LIGHT-EMITTING DEVICE, EXHIBIT-IRRADIATING ILLUMINATION DEVICE, MEAT-IRRADIATING ILLUMINATION DEVICE, VEGETABLE-IRRADIATING ILLUMINATION DEVICE, FRESH FISH-IRRADIATING ILLUMINATION DEVICE, GENERAL-PURPOSE ILLUMINATION DEVICE, AND SEMICONDUCTOR LIGHT-EMITTING SYSTEM

(71) Applicant: MITSUBISHI CHEMICAL CORPORATION, Chiyoda-ku (JP)

(72) Inventors: Hiroaki Sakuta, Odawara (JP); Yoshihito Satou, Ushiku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 13/918,514

(22) Filed: Jun. 14, 2013

(65) Prior Publication Data
US 2013/0277694 A1  Oct. 24, 2013

Related U.S. Application Data

(63) Continuation of application No. PCT/JP2012/064029, filed on May 31, 2012.

(30) Foreign Application Priority Data

Jun. 3, 2011 (JP) ................ 2011-125698
Mar. 30, 2012 (JP) ................ 2012-078631

(51) Int. Cl.
*H01L 33/50* (2010.01)
*H01L 25/075* (2006.01)
*C09K 11/77* (2006.01)
*H01L 27/15* (2006.01)
*C09K 11/08* (2006.01)

(52) U.S. Cl.
CPC .......... *H01L 33/502* (2013.01); *C09K 11/7739* (2013.01); *H01L 25/0753* (2013.01);
CPC ...... *H01L 33/504* (2013.01); *H01L 27/15* (2013.01); *C09K 11/0883* (2013.01); *C09K 11/7734* (2013.01); *H01L 2924/0002* (2013.01)

(58) Field of Classification Search
CPC .................. H01L 33/502; H01L 21/02–21/86;
H01L 27/15; H01L 33/504; H01L 25/0753
USPC ............... 257/89–90, E27.119, E33.001;
313/500–512; 438/463
See application file for complete search history.

(56) References Cited

U.S. PATENT DOCUMENTS

| | | | |
|---|---|---|---|
| 6,452,324 | B1 | 9/2002 | Soules et al. |
| 7,391,060 | B2 * | 6/2008 | Oshio ............................. 257/98 |
| 2006/0091790 | A1 | 5/2006 | Nagatomi et al. |
| 2007/0007494 | A1 * | 1/2007 | Hirosaki et al. ....... 252/301.4 R |
| 2008/0307818 | A1 * | 12/2008 | Min et al. ......... 62/264 |
| 2009/0066230 | A1 * | 3/2009 | Hirosaki et al. ............. 313/504 |
| 2009/0146549 | A1 | 6/2009 | Kimura et al. |
| 2009/0190326 | A1 | 7/2009 | Kon |
| 2010/0091215 | A1 | 4/2010 | Fukunaga et al. |
| 2010/0156274 | A1 | 6/2010 | Kim et al. |
| 2010/0187974 | A1 * | 7/2010 | Zhang et al. .................. 313/503 |
| 2010/0295464 | A1 | 11/2010 | Kasakura et al. |
| 2010/0327306 | A1 | 12/2010 | Van Der Burgt et al. |
| 2012/0112626 | A1 | 5/2012 | Sakuta et al. |
| 2012/0212123 | A1 | 8/2012 | Sakuta et al. |
| 2012/0267999 | A1 | 10/2012 | Sakuta et al. |
| 2012/0286646 | A1 | 11/2012 | Sakuta et al. |
| 2012/0319565 | A1 | 12/2012 | Sakuta et al. |
| 2013/0082289 | A1 | 4/2013 | Sakuta et al. |

FOREIGN PATENT DOCUMENTS

| | | |
|---|---|---|
| EP | 2 242 119 A1 | 10/2010 |
| JP | 03-235901 A | 10/1991 |
| JP | 10-255722 | 9/1998 |
| JP | 2002-198009 | 7/2002 |
| JP | 2006-124501 | 5/2006 |
| JP | 2008-268757 A | 11/2008 |
| JP | 2008-270781 | 11/2008 |

| | | |
|---|---|---|
| JP | 2009-176661 A | 8/2009 |
| JP | 2009-231525 | 10/2009 |
| JP | 2009-238729 | 10/2009 |
| JP | 2010-93132 | 4/2010 |
| JP | 2010-176992 | 8/2010 |
| JP | 2011-40241 | 2/2011 |
| JP | 2011-514667 | 5/2011 |
| WO | 2008/020541 | 2/2008 |
| WO | 2011/024818 | 3/2011 |

OTHER PUBLICATIONS

International Preliminary Report on Patentability and Written Opinion issued Dec. 19, 2013 in PCT/JP2012/064029 (English Translation).
International Search Report issued Jun. 26, 2012 in PCT/JP2012/064029 filed May 31, 2012.
U.S. Appl. No. 14/041,171, filed Sep. 30, 2013, Sakuta, et al.
U.S. Appl. No. 13/832,713, filed Mar. 15, 2013, Sakuta, et al.
"General-purpose fluorescent light Meat-kun", Prince Electric Co., Ltd., (retrieved on May 16, 2011, Internet: www.prince-d.co.jp/pdf/docs/pdf/catalog_pdf/fl?nrb?ca2011.pdf.
Notice of Reason for Rejection issued Jan. 20, 2015, in Japanese Patent Application No. 2012-123854 filed May 31, 2012 (with English translation).
Supplementary European Search Report issued Oct. 13, 2014, in European Patent Application No. 12792160.9 filed May 31, 2012.

* cited by examiner

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

The present invention provides a semiconductor light-emitting device which emits light with high chroma, and an exhibit-irradiating illumination device, a meat-irradiating illumination device, a vegetable-irradiating illumination device, a fresh fish-irradiating illumination device, a general-purpose illumination device, and a semiconductor light-emitting system which include the semiconductor light-emitting device. A semiconductor light-emitting device 1 comprises an LED chip 10 as a semiconductor light-emitting element and a phosphor 20 which uses the LED chip 10 as an excitation source to emit light. The phosphor contains at least a green phosphor and a red phosphor, and a value of intensity of light with a wavelength of 660 nm in a spectrum of beam-normalized light emitted from the semiconductor light-emitting device 1 is 170% or more and 300% or less of a value of intensity of light with a wavelength of 660 nm in a spectrum of beam-normalized reference light for color rendering evaluation.

27 Claims, 17 Drawing Sheets

| MUNSELL COLOR SYSTEM | | FIRST EXAMPLE | SECOND EXAMPLE | FIRST REFERENCE EXAMPLE | SECOND REFERENCE EXAMPLE | THIRD REFERENCE EXAMPLE | FOURTH REFERENCE EXAMPLE |
|---|---|---|---|---|---|---|---|
| 4.5R4/13 | R9(C*ab) | 87.3 | 94.7 | 84.5 | 73.3 | 72.9 | 86.3 |
| 4.5G5/8 | R11(C*ab) | 45.2 | 51.9 | 46.4 | 38.4 | 37.9 | 45.1 |
| 3PB3/11 | R12(C*ab) | 57.7 | 61.6 | 52.9 | 55.6 | 55.3 | 57.2 |
| R1-14(C*ab) (Ave.) | | 43.6 | 44.0 | 42.6 | 38.2 | 38.7 | 40.9 |
| ENERGY AREA (%) | | 97 | 113 | 74 | 100 | 48 | 78 |
| 500 nm INTENSITY RATIO (%) | | 22 | 132 | 97 | 100 | 85 | 109 |
| 660 nm INTENSITY RATIO (%) | | 193 | 226 | 422 | 100 | 82 | 154 |

Fig. 4

| RATIO OF EMISSION SPECTRUM OF FIRST EXAMPLE | 1.0 | 0.9 | 0.8 | 0.7 | 0.6 | 0.5 | 0.4 | 0.3 | 0.2 | 0.1 | 0.0 |
|---|---|---|---|---|---|---|---|---|---|---|---|
| RATIO OF EMISSION SPECTRUM OF SECOND EXAMPLE | 0.0 | 0.1 | 0.2 | 0.3 | 0.4 | 0.5 | 0.6 | 0.7 | 0.8 | 0.9 | 1.0 |
| R9 (C*ab) | 87.3 | 88.0 | 88.8 | 89.6 | 90.3 | 91.1 | 91.8 | 92.5 | 93.3 | 94.0 | 94.7 |
| R11 (C*ab) | 45.2 | 45.8 | 46.4 | 47.1 | 47.7 | 48.4 | 49.0 | 49.7 | 50.4 | 51.1 | 51.8 |
| R12 (C*ab) | 57.7 | 57.6 | 57.6 | 57.7 | 57.9 | 58.2 | 58.8 | 59.4 | 60.0 | 60.8 | 61.6 |
| R1-14 (C*ab) (Ave.) | 43.6 | 43.6 | 43.6 | 43.6 | 43.6 | 43.6 | 43.7 | 43.7 | 43.8 | 43.9 | 44.0 |
| ENERGY AREA (%) | 97 | 99 | 100 | 102 | 104 | 105 | 107 | 108 | 110 | 112 | 113 |
| 500 nm INTENSITY RATIO (%) | 22 | 33 | 44 | 55 | 66 | 77 | 88 | 99 | 110 | 121 | 132 |
| 660 nm INTENSITY RATIO (%) | 193 | 196 | 199 | 203 | 206 | 209 | 213 | 216 | 219 | 223 | 226 |

Fig. 5

|  | RELATIVE CHROMA (1) WHEN ASSUMING SPECTRAL REFLECTANCE CHARACTERISTICS IN WHICH WAVELENGTHS AROUND 435 nm ARE INTENSELY REFLECTED | RELATIVE CHROMA (2) WHEN ASSUMING SPECTRAL REFLECTANCE CHARACTERISTICS IN WHICH WAVELENGTHS AROUND 460 nm ARE INTENSELY REFLECTED | (1)/(2)*100 |
|---|---|---|---|
| SECOND EXAMPLE | 83 | 87 | 95 |
| FIRST REFERENCE EXAMPLE | 115 | 71 | 162 |
| FIFTH REFERENCE EXAMPLE | 138 | 69 | 200 |
| SIXTH REFERENCE EXAMPLE | 138 | 70 | 197 |

Fig. 9

|  | THIRD EXAMPLE | FOURTH EXAMPLE |
| --- | --- | --- |
| CORRELATED COLOR TEMPERATURE (K) | 3327 | 4865 |
| duv | -0.0242 | -0.0184 |
| BLUE PHOSPHOR CONTENT (wt%) | 14.4 | 13.0 |
| GREEN PHOSPHOR CONTENT (wt%) | 2.5 | 3.8 |
| RED PHOSPHOR CONTENT (wt%) | 2.5 | 1.9 |
| PHOSPHOR CONTENT (wt%) | 19.4 | 18.7 |

Fig. 10

| | THIRD EXAMPLE | SEVENTH REFERENCE EXAMPLE | FOURTH EXAMPLE | EIGHTH REFERENCE EXAMPLE |
|---|---|---|---|---|
| R9(C*ab) | 90.9 | 73.4 | 90.3 | 68.5 |
| R11(C*ab) | 51.4 | 38.3 | 55.5 | 42.4 |
| R12(C*ab) | 61.5 | 55.7 | 52.3 | 48.7 |
| R1-14(C*a) (Ave.) | 43.4 | 38.2 | 42.7 | 38.0 |
| ENERGY AREA (%) | 97 | 100 | 127 | 100 |
| 500 nm INTENSITY RATIO (%) | 138 | 100 | 135 | 100 |
| 660 nm INTENSITY RATIO (%) | 184 | 100 | 221 | 100 |

Fig. 13

SEMICONDUCTOR LIGHT-EMITTING DEVICE, EXHIBIT-IRRADIATING ILLUMINATION DEVICE, MEAT-IRRADIATING ILLUMINATION DEVICE, VEGETABLE-IRRADIATING ILLUMINATION DEVICE, FRESH FISH-IRRADIATING ILLUMINATION DEVICE, GENERAL-PURPOSE ILLUMINATION DEVICE, AND SEMICONDUCTOR LIGHT-EMITTING SYSTEM

CROSS-REFERENCE TO RELATED APPLICATIONS

This is a continuation of International Application PCT/JP2012/064029, filed on May 31, 2012, and designated the U.S., (and claims priority from Japanese Patent Application 2011-125698 which was filed on Jun. 3, 2011 and Japanese Patent Application 2012-078631 which was filed on Mar. 30, 2012) the entire contents of which are incorporated herein by reference.

TECHNICAL FIELD

The present invention relates to a semiconductor light-emitting device, an exhibit-irradiating illumination device, a meat-irradiating illumination device, a vegetable-irradiating illumination device, a fresh fish-irradiating illumination device, a general-purpose illumination device, and a semiconductor light-emitting system. In particular, the present invention relates to a semiconductor light-emitting device that emits light with high chroma, and an exhibit-irradiating illumination device, a meat-irradiating illumination device, a vegetable-irradiating illumination device, a fresh fish-irradiating illumination device, a general-purpose illumination device, and a semiconductor light-emitting system which include the semiconductor light-emitting device.

BACKGROUND ART

Incandescent electric lamps and fluorescent lamps are widely used as light sources for illumination devices.

In addition to these lamps, illumination devices using a semiconductor light-emitting element such as a LED or an organic EL (OLED) as a light source have been developed and used in recent years.

Since a variety of emission colors can be obtained with those semiconductor light-emitting elements, the development and use of illumination devices in which a plurality of semiconductor light-emitting elements with different emission colors are combined and the emission colors thereof are combined to obtain the radiated light of the desired color have been started.

Non-Patent Document 1 describes a fluorescent lamp which uses a narrow-band phosphor and which irradiates meat, fresh fish, or the like that are being sold at a grocery store. Patent Document 1 describes a fluorescent lamp as an alternative to a high-chroma high-pressure sodium lamp. Patent Document 2 describes a fluorescent light which is adjusted to form a spectrum having superior color rendering properties in all colors. Patent Document 3 describes a white semiconductor light-emitting device having superior color rendering properties in all colors (in particular, a color rendering property regarding vivid red).

Patent Document 1: Japanese Patent Application Laid-open No. H10-255722

Patent Document 2: Japanese Patent Application Laid-open No. 2002-198009

Patent Document 3: WO2011/024818

Non-Patent Document 1: "General-purpose fluorescent light Meat-kun", [online], Prince Electric Co., LTD., [retrieved on May 16, 2011], Internet <URL: http://www.prince-d.co.jp/pdct/docs/pdf/catalog_pdf/fl_nrb_ca2011.pdf>

However, careful consideration by the present inventors have revealed that the fluorescent lamp described in Non-Patent Document 1 has a wavelength region where an emission line of mercury used is present and a wavelength region with insufficient emission intensity as shown in a spectral energy distribution chart and that there may be cases where a difference in chroma of light between the two wavelength regions is significant. In particular, when irradiating light to a monochrome irradiated subject, a problem exists in that the irradiated subject cannot be vividly presented if a peak wavelength of a reflectance spectrum of the irradiated subject is within a range of the wavelength region with insufficient emission intensity.

In addition, the spectral energy distribution chart in Non-Patent Document 1 shows that overall chroma is low in a wavelength region of visible light. In particular, chroma is found to be low regarding vivid red, vivid green, and vivid blue.

As illustrated in the spectral distribution charts shown in FIGS. 1 and 3 of Patent Document 1, the fluorescent lamp described in Patent Document 1 has a wavelength region where an emission line of mercury used is present and a wavelength region with insufficient emission intensity. Therefore, in a similar manner to the fluorescent lamp described in Non-Patent Document 1, there is a problem in that some irradiated subjects cannot be vividly presented.

Patent Documents 2 and 3 do not describe, and do not even suggest, increasing chroma. Moreover, since Patent Document 2 does not describe a spectrum of light emitted by the fluorescent light according to the invention, the chroma of the fluorescent light cannot be analyzed.

DISCLOSURE OF THE INVENTION

The present invention has been made in consideration of the problems described above, and an object is to provide a semiconductor light-emitting device which emits light with high average chroma and, in particular, with significantly high chroma regarding vivid red and vivid green. Another object is to provide a semiconductor light-emitting device which emits light across all wavelength regions of visible light in a sufficient manner and at high chroma. Yet another object is to provide a semiconductor light-emitting device with significantly high chroma in vivid blue. Still another object is to provide an exhibit-irradiating illumination device, a meat-irradiating illumination device, a vegetable-irradiating illumination device, a fresh fish-irradiating illumination device, a general-purpose illumination device, and a semiconductor light-emitting system comprising such a semiconductor light-emitting device.

In order to achieve the objects described above, a semiconductor light-emitting device according to the present invention comprises: a semiconductor light-emitting element; and a phosphor which uses the semiconductor light-emitting element as an excitation source to emit light, wherein the phosphor contains at least a broadband green phosphor and a broadband red phosphor, and a value of intensity of light with a wavelength of 660 nm in a spectrum of light normalized with respect to luminous flux emitted from the semiconductor light-emitting device is 170% or more and 300% or less of a value of intensity of light with a wavelength of 660 nm in a spectrum of reference light normalized with respect to luminous flux for color rendering evaluation (hereinafter, also referred to as a semiconductor light-emitting device according to a second embodiment of the present invention).

According to a semiconductor light-emitting device configured as described above, light with high chroma can be emitted. Specifically, a semiconductor light-emitting device configured as described above is capable of emitting light such that an average C*ab value of respective test colors with special color rendering indices of R1 to R14 in a CIELab color space is greater than an average C*ab value of respective test colors with special color rendering indices of R1 to R14 based on a reference light for color rendering evaluation in a CIELab color space, a C*ab value of a test color of R9 which is a special color rendering index used for evaluating vivid red is greater by 5 or more than a C*ab value of the test color of R9 based on a reference light for color rendering evaluation, and a C*ab value of a test color of R11 which is a special color rendering index used for evaluating vivid green is greater by 5 or more than a C*ab value of the test color of R11 based on a reference light for color rendering evaluation.

In addition, since the semiconductor light-emitting device described above contains a broadband green phosphor and a broadband red phosphor and therefore has sufficient emission intensity across all wavelength regions of visible light and, at the same time, uses a semiconductor light-emitting element which does not have a mercury emission line as an excitation source of the phosphors, the semiconductor light-emitting device is able to vividly present any monochrome irradiated subject regardless of reflection characteristics of the monochrome irradiated subject. Furthermore, since a semiconductor light-emitting element is used as an excitation source, a longer product life than a fluorescent lamp may be expected.

A semiconductor light-emitting device according to another aspect of the present invention comprises: a semiconductor light-emitting element; and a phosphor which uses the semiconductor light-emitting element as an excitation source to emit light, wherein the phosphor contains at least a green phosphor and a red phosphor, and a value of an energy area of light with a wavelength of 600 nm or more and 780 nm or less in a spectrum of light normalized with respect to luminous flux emitted from the semiconductor light-emitting device is 85% or more and 150% or less of a value of an energy area of light with a wavelength of 600 nm or more and 780 nm or less in a spectrum of reference light normalized with respect to luminous flux for color rendering evaluation and, at the same time, intensity of light with a wavelength of 500 nm in a spectrum of light normalized with respect to luminous flux emitted from the semiconductor light-emitting device is 110% or more and 200% or less of intensity of light with a wavelength of 500 nm in a spectrum of reference light normalized with respect to luminous flux for color rendering evaluation (hereinafter, also referred to as a semiconductor light-emitting device according to a first embodiment of the present invention).

According to a semiconductor light-emitting device configured as described above, light with high chroma can be emitted. Specifically, a semiconductor light-emitting device configured as described above is capable of emitting light such that an average C*ab value of respective test colors with special color rendering indices of R1 to R14 in a CIELab color space is greater than an average C*ab value of respective test colors with special color rendering indices of R1 to R14 based on a reference light for color rendering evaluation in a CIELab color space, a C*ab value of a test color of R9 which is a special color rendering index used for evaluating vivid red is greater by 5 or more than a C*ab value of the test color of R9 based on a reference light for color rendering evaluation, and a C*ab value of a test color of R11 which is a special color rendering index used for evaluating vivid green is greater by 5 or more than a C*ab value of the test color of R11 based on a reference light for color rendering evaluation.

In addition, since the semiconductor light-emitting devices according to the first and second embodiments described above use a semiconductor light-emitting element which does not have a mercury emission line as an excitation source of the phosphors, the semiconductor light-emitting devices are able to vividly present any monochrome irradiated subject regardless of reflection characteristics of the monochrome irradiated subject.

Furthermore, the semiconductor light-emitting device according to the second embodiment described above may be configured such that a value of intensity of light with a wavelength of 500 nm in a spectrum of light normalized with respect to luminous flux is 15% or more and 200% or less of a value of intensity of light with a wavelength of 500 nm in a spectrum of reference light normalized with respect to luminous flux for color rendering evaluation.

According to such a configuration, light can be emitted such that a C*ab value of a test color of R12 which is a special color rendering index used for evaluating vivid blue is greater by 2 or more than a C*ab value of the test color of R12 based on a reference light for color rendering evaluation.

A configuration may be adopted in which an emission peak wavelength of the red phosphor is 640 nm or more and 700 nm or less.

The semiconductor light-emitting device may be configured so as to: emit light with a correlated color temperature of 2500 K or more and 7000 K or less; emit light with a chromaticity coordinate in an XY chromaticity diagram of a CIE (1931) XYZ color system whose value of a deviation duv from a black-body radiation trajectory curve is −0.03 or more and 0.03 or less; or emit light with a chromaticity coordinate in an XY chromaticity diagram of a CIE (1931) XYZ color system whose value of a deviation duv from a black-body radiation trajectory curve is −0.03 or more and −0.005 or less.

Moreover, the phosphor may contain a blue phosphor. In addition, an emission peak wavelength of the blue phosphor may be 440 nm or more and 500 nm or less. Furthermore, a half-width of the blue phosphor may be 20 nm or more and 90 nm or less. The blue phosphor may be $(Sr,Ba,Ca)_5(PO_4)_3Cl$:Eu or $BaMgAl_{10}O_{17}$:Eu. In addition, the green phosphor may be at least one type selected from the group consisting of $(Sr,Ba)_2SiO_4$:Eu, β-sialon, and $(Ba,Sr)_3Si_6O_{12}N_2$:Eu. When β-sialon is used as the green phosphor, durability can be increased compared to a case where $BSS((Ba,Ca,Sr,Mg)_2SiO_4$:Eu) is used as the green phosphor. Furthermore, the red phosphor may be $(Sr,Ca)AlSi(N,O)_3$.

A C*ab value of the test color of R9 may be a value that is 105% or more of a C*ab value of the test color of R9 based on a reference light for color rendering evaluation, a C*ab value of the test color of R11 may be a value that is 110% or more of a C*ab value of the test color of R11 based on a reference light for color rendering evaluation, and a C*ab value of the test color of R12 may be a value that is 103% or more of a C*ab value of the test color of R12 based on a reference light for color rendering evaluation. Accordingly, an average value of C*ab values of respective test colors with special color rendering indices of R1 to R14 can be set greater than an average value of C*ab values of respective test colors with special color rendering indices of R1 to R14 based on a reference light for color rendering evaluation.

An exhibit-irradiating illumination device according to the present invention comprises a semiconductor light-emitting device having any of the features described above. Such a configuration enables an irradiated subject to be presented more vividly.

A meat-irradiating illumination device according to the present invention comprises a semiconductor light-emitting device having any of the features described above. Such a configuration enables meat (more specifically, for example, vivid red meat) that is an irradiated subject to be presented more vividly.

A vegetable-irradiating illumination device according to the present invention comprises a semiconductor light-emitting device having any of the features described above. Such a configuration enables vegetables (more specifically, for example, vivid green vegetables or vivid red vegetables) that are irradiated subjects to be presented more vividly.

A fresh fish-irradiating illumination device according to the present invention comprises a semiconductor light-emitting device having any of the features described above. Such a configuration enables fresh fish (more specifically, for example, vivid blue fish or vivid red flesh of a fish) that is an irradiated subject to be presented more vividly.

A general-purpose illumination device according to the present invention comprises a semiconductor light-emitting device having any of the features described above. Such a configuration enables an irradiated subject such as a residential space or a work space to be presented more vividly.

A semiconductor light-emitting system according to the present invention comprises, as semiconductor light-emitting devices, a first semiconductor light-emitting device that is a semiconductor light-emitting device having any of the features described above, and a second semiconductor light-emitting device which emits light such that a difference between an average value of $C^*ab$ values of respective test colors with special color rendering indices of R1 to R14 and a corresponding average value of the first semiconductor light-emitting device is 0.5 or more. Such a configuration enables light emitted by the semiconductor light-emitting system to be adjusted by adjusting intensity of light emitted by the first semiconductor light-emitting device and intensity of light emitted by the second semiconductor light-emitting device.

A semiconductor light-emitting system according to another aspect of the present invention comprises, as semiconductor light-emitting devices, a first semiconductor light-emitting device that is a semiconductor light-emitting device having any of the features described above, and a second semiconductor light-emitting device which emits light such that a difference between a $C^*ab$ value of a test color with a special color rendering index of R9 and a corresponding value of the first semiconductor light-emitting device is 0.5 or more. Such a configuration is capable of realizing a semiconductor light-emitting system in which chroma regarding vivid red can be adjusted.

A semiconductor light-emitting system according to yet another aspect of the present invention comprises, as semiconductor light-emitting devices, a first semiconductor light-emitting device that is a semiconductor light-emitting device having any of the features described above, and a second semiconductor light-emitting device which emits light such that a difference between a $C^*ab$ value of a test color with a special color rendering index of R11 and a corresponding value of the first semiconductor light-emitting device is 0.5 or more. Such a configuration is capable of realizing a semiconductor light-emitting system in which chroma regarding vivid green can be adjusted.

A semiconductor light-emitting system according to another aspect of the present invention comprises, as semiconductor light-emitting devices, a first semiconductor light-emitting device that is a semiconductor light-emitting device having any of the features described above, and a second semiconductor light-emitting device which emits light such that a difference between a $C^*ab$ value of a test color with a special color rendering index of R12 and a corresponding value of the first semiconductor light-emitting device is 0.5 or more. Such a configuration is capable of realizing a semiconductor light-emitting system in which chroma regarding vivid blue can be adjusted.

A semiconductor light-emitting system according to yet another aspect of the present invention comprises, as semiconductor light-emitting devices, a first semiconductor light-emitting device that is a semiconductor light-emitting device having any of the features described above, and a second semiconductor light-emitting device which emits light with a correlated color temperature that differs from a correlated color temperature of light emitted by the first semiconductor light-emitting device. Such a configuration is capable of realizing a semiconductor light-emitting system in which only a correlated color temperature can be changed while maintaining a constant chroma of emitted synthetic light.

A semiconductor light-emitting system according to another aspect of the present invention comprises, as semiconductor light-emitting devices, a first semiconductor light-emitting device that is a semiconductor light-emitting device having any of the features described above, and a second semiconductor light-emitting device which emits light with a value of an average color rendering index Ra of 80 or more. Such a configuration enables color rendering properties and chroma of all colors in a visible light region to be adjusted by respectively adjusting emission intensity of the first semiconductor light-emitting device and emission intensity of the second semiconductor light-emitting device.

A semiconductor light-emitting device according to the present invention is capable of emitting light with high average chroma and, in particular, with significantly high chroma regarding vivid red and vivid green. In addition, an exhibit-irradiating illumination device, a meat-irradiating illumination device, a vegetable-irradiating illumination device, a fresh fish-irradiating illumination device, a general-purpose illumination device, and a semiconductor light-emitting system according to the present invention are capable of producing operational effects similar to those of a semiconductor light-emitting device according to the present invention.

BRIEF DESCRIPTION OF THE DRAWINGS

FIG. 4 is a table showing characteristics of light emitted in the first example, the second example, a first reference example, a second reference example, a third reference example, and a fourth reference example;

FIG. 5 is a table showing changes in characteristics calculated based on synthetic spectra created by combining a emission spectrum normalized with respect to luminous flux of the semiconductor light-emitting device according to the first example with a emission spectrum normalized with respect to luminous flux of the semiconductor light-emitting device according to the second example at various ratios;

FIG. 9 is a table showing relative chroma when light according to the respective examples is irradiated on an irradiated subject having the spectral reflectance characteristics shown in FIG. 7, relative chroma when light according to the respective examples is irradiated on an irradiated subject having the spectral reflectance characteristics shown in FIG. 8, and a rate of change in relative chroma in accordance with the irradiated subjects;

FIG. 10 is a table showing contents (weight percent concentration) of respective phosphors in a silicone resin composition for encapsulating a light-emitting diode element used in the respective semiconductor light-emitting devices;

FIG. 13 is a table showing measurement results of emission characteristics of the semiconductor light-emitting device according to the third example and emission characteristics of the semiconductor light-emitting device according to the fourth example;

BEST MODE FOR CARRYING OUT THE INVENTION

The embodiments of the present invention will be explained below with reference to the appended drawings.

The present invention is not limited to the contents described hereinbelow and can be changed in any manner, without departing from the scope and essence thereof.

The drawings used in the explanation of the present embodiment all illustrate schematically the properties of the semiconductor light-emitting device 1 in accordance with the present invention and can be partially enhanced, enlarged, reduced, or omitted, as necessary, to deepen the understanding.

Further, various numerical values used herein are all illustrative and can be variously changed, as necessary.

Figure 1:
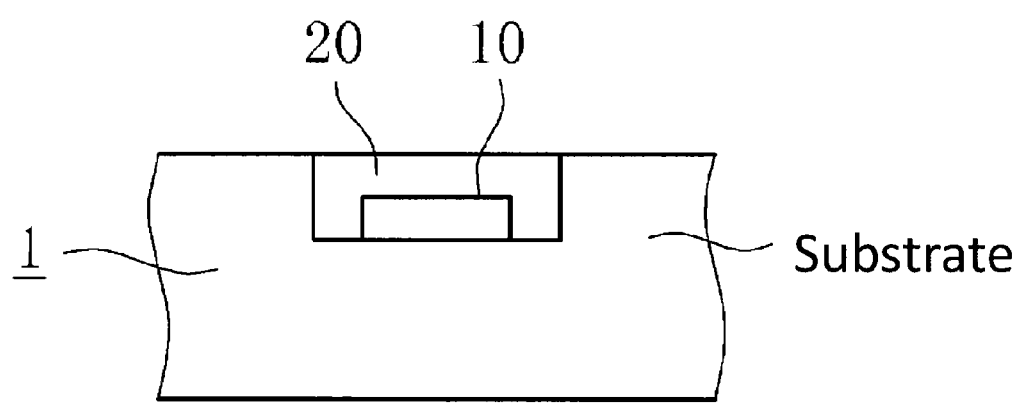
FIG. 1 is an explanatory diagram showing a configuration example of a semiconductor light-emitting device according to an embodiment of the present invention.

FIG. 1 is an explanatory diagram showing a configuration example of a semiconductor light-emitting device 1 according to an embodiment of the present invention. As shown in FIG. 1, the semiconductor light-emitting device 1 according to respective examples of an embodiment of the present invention comprises an LED chip 10 that is a semiconductor light-emitting element and a phosphor 20 which converts a wavelength of light emitted by the LED chip 10. In the semiconductor light-emitting device 1 according to the respective embodiments, preferably, the LED chip 10 is a violet light-emitting diode element and the phosphor 20 contains a green phosphor, a red phosphor, and a blue phosphor.

(Similarities and Differences Between the Semiconductor Light-Emitting Device 1 According to a First Embodiment and the Semiconductor Light-Emitting Device 1 According to a Second Embodiment)

Both the semiconductor light-emitting device 1 according to the first embodiment and the semiconductor light-emitting device 1 according to the second embodiment normally emit light which contains, as components, ultraviolet light and/or violet light emitted by the LED chip 10 that is a violet light-emitting diode element, blue light produced by wavelength conversion by a blue phosphor of a part of the ultraviolet light and/or violet light emitted by the LED chip 10 that is a violet light-emitting diode element, green light produced by wavelength conversion by a green phosphor of another part of the ultraviolet light and/or violet light, and red light produced by wavelength conversion by a red phosphor of yet another part of the ultraviolet light and/or violet light. Moreover, usable semiconductor light-emitting elements are not limited to a violet light-emitting diode element and a blue light-emitting diode or a near-ultraviolet light-emitting diode can also be used. When using a blue light-emitting diode, a blue phosphor need not always be contained.

(Semiconductor Light-Emitting Device 1 According to First Embodiment)

With the semiconductor light-emitting device 1 according to the first embodiment, a value of an energy area of light with a wavelength of 600 nm or more and 780 nm or less among a spectrum of light normalized with respect to luminous flux is 85% or more and 150% or less of a value of an energy area of light with a wavelength of 600 nm or more and 780 nm or less among a spectrum of reference light normalized with respect to luminous flux for color rendering evaluation. With respect to the value of an energy area of light with a wavelength of 600 nm or more and 780 nm or less among a spectrum of reference light normalized with respect to luminous flux for color rendering evaluation, the value of an energy area of light with a wavelength of 600 nm or more and 780 nm or less among a spectrum of light normalized with respect to luminous flux is preferably 90% or more, more preferably 101% or more, and particularly preferably 106% or more, and preferably 130% or less, more preferably 125% or less, even more preferably 117% or less, and particularly preferably 115% or less.

An "energy area of light with a wavelength of 600 nm or more and 780 nm or less among a spectrum of light normalized with respect to luminous flux" is a value obtained by dividing an integral value of a spectral radiant flux with a wavelength of 600 nm or more and 780 nm or less by total flux. Hereinafter, a "value obtained by dividing an integral value of a spectral radiant flux with a wavelength of 600 nm or more and 780 nm or less by total flux" will simply be referred to as an energy area.

An energy area will now be described. An xy chromaticity diagram as specified by the CIE (hereinafter, referred to as a CIE xy chromaticity diagram) is used to represent how a color is perceived. Chromaticity as represented in the CIE xy chromaticity diagram is calculated using three spectral sensitivities (color-matching functions) which correspond to the human eye. The three spectral sensitivities are constituted by x(λ), y(λ), and z(λ), and chromaticity is calculated in accordance with a proportion of respective stimuli (a proportion of values of spectral sensitivities) upon incidence of light on an eye. Since a value of each spectral sensitivity is calculated based on an amount of energy (in other words, an energy area) of a spectrum of light at each wavelength, comparing energy areas is synonymous with comparing proportions of stimuli using numerical values.

When comparing colors of an irradiated subject respectively produced by light emitted from different light sources, a difference in brightness among the light sources causes the colors of the irradiated subject to be perceived differently. Therefore, in order to compare light emitted by the respective light sources, the comparison must be performed by normalizing a spectrum of each light with a flux (specifically, by a value obtained by dividing an integral value of a spectral radiant flux by total flux).

Moreover, a reference light for color rendering evaluation refers to a reference light prescribed by JIS (Japanese Industrial Standards) Z8726:1990 which defines a method for evaluating color rendering properties of a light source. The reference light for color rendering evaluation is light of a full radiator when a correlated color temperature of light emitted by the semiconductor light-emitting device 1 that is a sample light source is lower than 5000 K and CIE (Commission Internationale de l'Eclairage) daylight when the correlated color temperature is 5000 K or more. Definitions of a full radiator and CIE daylight are in adherence to JIS Z8720:2000 (corresponding international standard: ISO/CIE 10526:1991).

In addition, a spectrum of light normalized with respect to luminous flux refers to a spectrum (a spectral radiant flux $\Phi_e$ in Expression (1) below) normalized so that a flux $\Phi$ determined by Expression (1) below is 1 (unity).

[Expression 1]

$$\Phi = K_m \int_{380}^{780} V_\lambda \Phi_e d\lambda \qquad (1)$$

In Expression (1) above,
$\Phi$: flux [lm],
$K_m$: maximum spectral luminous efficiency [lm/W],
$V_\lambda$: photopic spectral luminous efficiency,
$\Phi_e$: spectral radiant flux [W/nm], and
$\lambda$: wavelength [nm].

Moreover, when light emitted by the semiconductor light-emitting device 1 has a color other than "white", a "reference light normalized with respect to luminous flux for color rendering evaluation" refers to a reference light corresponding to an isotemperature line tangent to a chromaticity coordinate of the light when isotemperature lines are extended in an XY chromaticity diagram of a CIE (1931) XYZ color system. In a similar manner, when light emitted by the semiconductor light-emitting device 1 has a color other than "white", a "correlated color temperature" refers to a correlated color temperature corresponding to an isotemperature line tangent to a chromaticity coordinate of the light when isotemperature lines are extended in an XY chromaticity diagram of a CIE (1931) XYZ color system.

(Semiconductor Light-Emitting Device 1 According to Second Embodiment)

In the semiconductor light-emitting device 1 according to the second embodiment, the green phosphor is a broadband green phosphor and the red phosphor is a broadband red phosphor. Furthermore, with the semiconductor light-emitting device 1 according to the second embodiment, a value of intensity of light with a wavelength of 660 nm in a spectrum of light normalized with respect to luminous flux is 170% or more and 300% or less of a value of intensity of light with a wavelength of 660 nm in a spectrum of reference light normalized with respect to luminous flux for color rendering evaluation. The semiconductor light-emitting device 1 according to the second embodiment emits light such that with respect to the value of intensity of light with a wavelength of 660 nm in a spectrum of reference light normalized with respect to luminous flux for color rendering evaluation, the value of intensity of light with a wavelength of 660 nm in a spectrum of light normalized with respect to luminous flux is preferably 180% or more, more preferably 190% or more, even more preferably 210% or more, and particularly preferably 218% or more, and preferably 260% or less, more preferably 250% or less, even more preferably 240% or less, and particularly preferably 230% or less.

When using a broadband green phosphor and a broadband red phosphor, the value of intensity of light with a wavelength of 660 nm in a spectrum of light normalized with respect to luminous flux must be set to within the range described earlier. This is because when emission intensity at a wavelength of 660 nm is increased, the use of a broadband phosphor enables emission intensity at, for example, intensity at a wavelength of 630 nm to be also increased. However, for example, when a narrow-band red phosphor is used as the red phosphor, due to an extremely narrow half-width, emission intensity at, for example, intensity of a wavelength of 630 nm cannot always be increased even if emission intensity at a wavelength of 660 nm is increased. In other words, in the second embodiment, it is not important to only increase the emission intensity at a wavelength of 660 nm. Rather, by setting the value of intensity of light with a wavelength of 660 nm in a spectrum of light normalized with respect to luminous flux to within the range described earlier when using a broadband green phosphor and a broadband red phosphor, an integral value of a spectral radiant flux at a wavelength of 600 nm or more and 780 nm or less can be set to a predetermined value as is the case with the first embodiment.

Furthermore, when the green phosphor is a broadband green phosphor and the red phosphor is a broadband red phosphor, since sufficient emission intensity is provided across all wavelength regions in visible light as compared to a case where a narrow-band green phosphor and a narrow-band red phosphor are used, any monochrome irradiated object can be vividly presented regardless of reflection characteristics of the monochrome irradiated object.

Moreover, with the semiconductor light-emitting device 1 according to the first embodiment, a value of intensity of light with a wavelength of 500 nm in a spectrum of light normalized with respect to luminous flux emitted from the semiconductor light-emitting device is preferably 110% or more and 200% or less of a value of intensity of light with a wavelength of 500 nm in a spectrum of reference light normalized with respect to luminous flux for color rendering evaluation. The semiconductor light-emitting device 1 according to the first embodiment emits light such that with respect to the value of intensity of light with a wavelength of 500 nm in a spectrum of reference light normalized with respect to luminous flux for color rendering evaluation, the value of intensity of light with a wavelength of 500 nm in a spectrum of light normalized with respect to luminous flux emitted from the semiconductor light-emitting device is preferably 115% or more, more preferably 120% or more, even more preferably 125% or more, and particularly preferably 130% or more, and preferably 150% or less and more preferably 145% or less.

In addition, with the semiconductor light-emitting device 1 according to the second embodiment, a value of intensity of light with a wavelength of 500 nm in a spectrum of light normalized with respect to luminous flux emitted from the semiconductor light-emitting device is preferably 15% or more and 200% or less of a value of intensity of light with a wavelength of 500 nm in a spectrum of reference light normalized with respect to luminous flux for color rendering evaluation. The semiconductor light-emitting device 1 according to the second embodiment emits light such that with respect to the value of intensity of light with a wavelength of 500 nm in a spectrum of reference light normalized with respect to luminous flux for color rendering evaluation, the intensity of light with a wavelength of 500 nm in a spectrum of light normalized with respect to luminous flux emitted from the semiconductor light-emitting device is preferably 20% or more, more preferably 60% or more, even more preferably 95% or more, particularly preferably 110% or more, and more particularly preferably 115% or more, and preferably 150% or less, more preferably 145% or less, even more preferably 140% or less, and particularly preferably 135% or less.

In the present invention, for light emitted by a semiconductor light-emitting device to satisfy the specific energy area and the specific 660 nm intensity ratio described above, a light source and types and contents of phosphors must be appropriately selected and, in particular, a value of intensity of light with a wavelength of 500 nm must be increased. This is conceivably because increasing an emission peak of a red region in order to vividly present red requires increasing a blue-green region that is in a complementary relationship with the red region or, in other words, increasing a value of intensity of light with a wavelength of 500 nm.

While the intensity of light with a wavelength of 500 nm can be increased by using a broadband green phosphor as the green phosphor, using a broadband blue phosphor as the blue phosphor, or using a narrow-band red phosphor as the red phosphor, methods of increasing the intensity of light with a wavelength of 500 nm are not limited thereto.

Specific examples of the above-mentioned phosphors are described below.

The phosphors listed hereinbelow exemplify the advantageous phosphors in the present embodiment, but the phosphors that can be used are not limited thereto and phosphors of various types can be used without departing from the scope of the present invention.

(Green Phosphors)

The green phosphor in the semiconductor light-emitting device according to the present invention preferably has an emission peak wavelength within a wavelength range that is normally 500 nm or more, preferably 510 nm or more, and more preferably 515 nm or more, and normally less than 550 nm, preferably 542 nm or less, and more preferably 535 nm or less. This is because intensity at a wavelength of 500 nm can be readily increased and, as a result, a value of intensity of light with a wavelength of 500 nm in a spectrum of light normalized with respect to luminous flux can be adjusted within the range described above. While the green phosphor in the semiconductor light-emitting device according to the second embodiment is a broadband phosphor (specifically, a phosphor with a half-width of 25 nm or more), the green phosphor in the semiconductor light-emitting device according to the first embodiment is not limited to a broadband phosphor. In other words, a phosphor with a half-width of less than 25 nm may be used. In addition, when using a green phosphor with a half-width of 25 nm or more, preferably 45 nm or more, and more preferably 60 nm or more, and normally 140 nm or less, preferably 120 nm or less, and more preferably 100 nm or less, intensity at a wavelength of 500 nm can be readily increased and, as a result, a value of intensity of light with a wavelength of 500 nm in a spectrum of light normalized with respect to luminous flux can be adjusted within the range described above. As the green phosphor, for example, the semiconductor light-emitting device according to the present invention preferably uses $(Y,Lu)_3(Al,Ga)_5O_{12}$:Ce, $CaSc_2O_4$:Ce, $Ca_3(Sc,Mg)_2Si_3O_{12}$:Ce, $(Sr,Ba)_2SiO_4$:Eu (BSS), $(Si,Al)_6(O,N)_8$:Eu(β-sialon), $(Ba,Sr)_3Si_6O_{12}N_2$:Eu(BSON), $SrGa_2S_4$:Eu, $BaMgAl_{10}O_{17}$:Eu,Mn, or $(Ba,Sr,Ca,Mg)Si_2O_2N_2$:Eu. Among these, BSS, β-sialon, BSON, $SrGa_2S_4$:Eu, or $BaMgAl_{10}O_{17}$:Eu,Mn is more preferably used, BSS, β-sialon, or BSON is even more preferably used, β-sialon, BSON is particularly preferably used, and β-sialon is most preferably used. In the examples, β-sialon is used as a green phosphor.

(Red Phosphor)

The red phosphor in the semiconductor light-emitting device according to the present invention preferably has an emission peak wavelength within a wavelength range that is normally 570 nm or more, preferably 580 nm or more, more preferably 585 nm or more, even more preferably 610 nm or more, and particularly preferably 625 or more, and normally 780 nm or less, preferably 700 nm or less, and more preferably 680 nm or less. While the red phosphor in the semiconductor light-emitting device according to the second embodiment is a broadband phosphor (specifically, a phosphor with a half-width of 25 nm or more), the red phosphor in the semiconductor light-emitting device according to the first embodiment is not limited to a broadband phosphor. In other words, the red phosphor may be a phosphor with a half-width of less than 25 nm (hereinafter, sometimes referred to as a "narrow-band phosphor"). As the red phosphor in the first embodiment, favorable examples include $CaAlSi(N,O)_3$:Eu, $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Sr,Ba)_3SiO_5$:Eu, $(Ca,Sr)S$:Eu, $SrAlSi_4N_7$:Eu, $(La,Y)_2O_2S$:Eu, β-diketone Eu complexes such as Eu(dibenzoylmethane)$_3$.1,10-phenanthroline complex, carboxylic acid Eu complexes, $K_2SiF_6$:Mn, and Mn-activated germanate. $(Ca,Sr,Ba)_2Si_5(N,O)_8$:Eu, $(Sr,Ca)AlSi(N,O)_3$:Eu, $SrAlSi_4N_7$:Eu, $(La,Y)_2O_2S$:Eu, $K_2SiF_6$:Mn (however, a part of Si may be substituted with Al or Na), or Mn-activated germanate is preferably used. In particular, $(Sr,Ca)AlSi(N,O)_3$:Eu or $SrAlSi_4N_7$:Eu is more preferable, and $(Sr,Ca)AlSi(N,O)_3$:Eu is even more preferable. In addition, as a narrow-band red phosphor, $(La,Y)_2O_2S$:Eu, $K_2SiF_6$:Mn, or Mn-activated germanate is preferably used.

As the broadband red phosphor in the second embodiment, favorable examples include $CaAlSi(N,O)_3$:Eu, $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Sr,Ba)_3SiO_5$:Eu, $(Ca,Sr)S$:Eu, $SrAlSi_4N_7$:Eu, β-diketone Eu complexes such as Eu(dibenzoylmethane)$_3$.1,10-phenanthroline complex, and carboxylic acid Eu complexes, and $(Ca,Sr,Ba)_2Si_5(N,O)_8$:Eu, $(Sr,Ca)AlSi(N,O)_3$:Eu, or $SrAlSi_4N_7$:Eu is preferably used. In particular, $(Sr,Ca)AlSi(N,O)_3$:Eu or $SrAlSi_4N_7$:Eu is more preferable, and $(Sr,Ca)AlSi(N,O)_3$:Eu is even more preferable. In the examples, $CaAlSi(N,O)_3$:Eu is used as the red phosphor.

Among the examples of red phosphor, particularly, when using a red phosphor with a peak wavelength of 640 nm or more and 700 nm or less, preferably 650 nm or more and 680 nm or less, and more preferably 655 nm or more and 670 nm or less, intensity at a wavelength of 660 nm can be readily increased and, as a result, a value of intensity of light with a wavelength of 660 nm in a spectrum of light normalized with respect to luminous flux can be adjusted within the range described above.

(Blue Phosphors)

The semiconductor light-emitting device according to the present invention can also contain a blue phosphor. The blue phosphor in the semiconductor light-emitting device according to the present invention preferably has an emission peak wavelength that is normally within a wavelength range of 420 nm or more, preferably 430 nm or more, more preferably 440 nm or more, and normally less than 500 nm, preferably 490 nm or less, more preferably 480 nm or less, even more preferably 470 nm or less, and particularly preferably 460 nm or less. When using a blue phosphor in the semiconductor light-emitting device according to the present invention, types of the blue phosphor are not particularly limited. In the semiconductor light-emitting device according to the second embodiment, the blue phosphor is preferably a broadband phosphor (specifically, a phosphor with a half-width of 20 nm or more). As the blue phosphor used in the semiconductor light-emitting device according to the present invention, (Ca,Sr,Ba)MgAl$_{10}$O$_{17}$:Eu, (Sr,Ca,Ba,Mg)$_{10}$(PO$_4$)$_6$(Cl,F)$_2$:EU, (Ba,Ca,Mg,Sr)$_2$SiO$_4$:Eu, or (Ba,Ca,Sr)$_3$MgSi$_2$O$_8$:Eu is preferable, (Ba,Sr)MgAl$_{10}$O$_{17}$:Eu, (Ca,Sr,Ba)$_{10}$(PO$_4$)$_6$(Cl,F)$_2$:Eu, or Ba$_3$MgSi$_2$O$_8$:Eu is more preferable, Sr$_{10}$(PO$_4$)$_6$Cl$_2$:Eu or BaMgAl$_{10}$O$_{17}$:Eu is even more preferable, and (Sr,Ba,Ca)$_5$(PO$_4$)$_3$Cl:Eu (more specifically, Sr$_5$(PO$_4$)$_3$Cl:Eu (hereinafter, also referred to as SCA) or (Sr$_{1-x}$Ba$_x$)$_5$(PO$_4$)$_3$Cl:Eu (where x>0 and preferably 0.4>x>0.12) (hereinafter, also referred to as SBCA)) is particularly preferable. In the examples, as the blue phosphor, Sr$_5$(PO$_4$)$_3$Cl:Eu with a half-width of 30 nm and an emission peak wavelength of 450 nm and (Sr$_{1-x}$Ba$_x$)$_5$(PO$_4$)$_3$Cl:Eu (x>0) with a half-width of 80 nm (in other words, a half-width that is wider than the half-width of the blue phosphor described above) and an emission peak wavelength of 475 nm are used.

Among the examples of blue phosphor, particularly, when using a blue phosphor with a peak wavelength of 440 nm or more and 500 nm or less, preferably 445 nm or more and 490 nm or less, and more preferably 460 nm or more and 480 nm or less, intensity at a wavelength of 500 nm can be readily increased and, as a result, a value of intensity of light with a wavelength of 500 nm in a spectrum of light normalized with respect to luminous flux can be adjusted within the range described above. In addition, when using a blue phosphor with a half-width of 20 nm or more and 90 nm or less, preferably 30 nm or more and 85 nm or less, and more preferably 40 nm or more and 83 nm or less, intensity at a wavelength of 500 nm can be readily increased and, as a result, a value of intensity of light with a wavelength of 500 nm in a spectrum of light normalized with respect to luminous flux can be adjusted within the range described above.

The phosphor 20 may be in the form of a powder or a light-emitting ceramic including a phosphor phase in a ceramic structure.

In the case of a powder phosphor, it is preferred that the phosphor particles be disposed and immobilized in a transparent fixed matrix constituted by a polymer material or glass, or that the phosphor particles be deposited and immobilized in the form of a layer by electrodeposition or some other method on the surface of an appropriate member.

(LED Chip 10)

As the LED chip 10 according to the first and second embodiments, a semiconductor light-emitting element that emits light at 360 nm or more and 420 nm or less is preferable. Moreover, examples of such a semiconductor light-emitting element include a violet light-emitting diode element which more preferably has a wavelength of 390 nm or more and 420 nm or less. A violet light-emitting diode element is used as the LED chip 10 in the examples.

The semiconductor light emitting element is preferably a light-emitting diode element having a light-emitting section of a pn junction type that is formed by a gallium nitride, zinc oxide or silicon carbide semiconductor.

Moreover, a blue light-emitting diode element which emits light at 420 nm or more and 480 nm or less may be used as the LED chip 10. In this case, the use of a blue phosphor is not required. When a blue phosphor is not used (in other words, when a blue light-emitting diode element is used), a value of intensity of light with a wavelength of 500 nm can be set within the range described above by using a green phosphor with a half-width of 50 nm or more and 120 nm or less, preferably 60 nm or more and 115 nm or less, and more preferably 80 nm or more and 110 nm or less. In addition, a value of intensity of light with a wavelength of 500 nm can also be set within the range described above by using, in combination, a blue light-emitting diode element that emits light at 420 nm to 480 nm and another blue light-emitting diode element with a peak wavelength that is longer by 10 nm or more.

Hereinafter, a result of a simulation for understanding a relationship among types of phosphors, spectra, and chroma will be described. A feature of the semiconductor light-emitting device according to the present invention is that an energy area satisfies a specific value or a 600 nm intensity ratio satisfies a specific value. In order to manufacture a semiconductor light-emitting device that emits a spectrum having such a feature, a light source as well as types and contents of phosphors must be appropriately selected. By taking the results of the present simulation into consideration, persons skilled in the art may more readily implement a semiconductor light-emitting device that emits a spectrum having a feature of the present invention.

(Relationship Among Blue Phosphor, Spectra, and Chroma)

In the present simulation, characteristics of light emitted by semiconductor light-emitting devices including the following parameters were evaluated by changing types of the blue phosphor while keeping the green phosphor and the red phosphor unchanged.

i) A value of an energy area of light with a wavelength of 600 nm or more and 780 nm or less among a spectrum of reference light normalized with respect to luminous flux for color rendering evaluation relative to a value of an energy area of light with a wavelength of 600 nm or more and 780 nm or less among a spectrum of light normalized with respect to luminous flux emitted from a semiconductor light-emitting device (hereinafter, also referred to as a 600-780 nm integration ratio)

ii) A value of intensity of light with a wavelength of 500 nm among a spectrum of reference light normalized with respect to luminous flux for color rendering evaluation relative to intensity of light with a wavelength of 500 nm among a spectrum of light normalized with respect to luminous flux (hereinafter, also referred to as a 500 nm intensity ratio)

iii) A value of intensity of light with a wavelength of 660 nm among a spectrum of reference light normalized with respect to luminous flux for color rendering evaluation relative to intensity of light with a wavelength of 660 nm among a spectrum of light normalized with respect to luminous flux (hereinafter, also referred to as a 660 nm intensity ratio)

The results are given in Table 1.

TABLE 1

| | Blue phosphor (peak, half-width) | | |
|---|---|---|---|
| | SCA (450 nm, 25 nm) | SBCA1 (454 nm, 34 nm) | SBCA2 (475 nm, 70 nm) |
| Correlated color temperature | 3357 | 3357 | 3357 |
| Deviation duv from black-body radiation trajectory curve | −0.023 | −0.023 | −0.023 |
| Ra | 91 | 84 | 70 |
| R(9-12) | 85 | 66 | 35 |
| R9 | 92 | 60 | 35 |
| R9C * ab | 74 | 78 | 81 |
| R11C * ab | 40 | 43 | 46 |
| R12C * ab | 60 | 61 | 64 |
| R(1-14)C * ab (Ave.) | 41 | 41 | 41 |
| 600-780 nm integration ratio | 0.48 | 0.53 | 0.56 |
| 500 nm intensity ratio | 0.20 | 0.86 | 1.38 |
| 660 nm intensity ratio | 0.78 | 0.86 | 0.92 |

In Table 1, SCASN is used as the red phosphor, β-sialon is used as the green phosphor, and one of SCA($Sr_5(PO_4)_3Cl$:Eu), SBCA1(($Sr_{0.88}Ba_{0.12}$)$_5(PO_4)_3$Cl:EU), and SBCA2(($Sr_{0.79}Ba_{0.21}$)$_5(PO_4)_3$Cl:EU) is used as the blue phosphor. Table 1 shows that, by using a blue phosphor with a large half-width or, in other words, a broadband blue phosphor as the blue phosphor, the 500 nm intensity ratio can be improved, the 660 nm intensity ratio can be improved, and the 600-780 nm integration ratio can be improved. Thus, it is understandable that chroma improves accordingly.

(Relationship Among Red Phosphor, Spectra, and Chroma)

In the present simulation, characteristics of light emitted by semiconductor light-emitting devices were evaluated by changing types of the red phosphor while keeping the blue phosphor and the green phosphor unchanged.

The results are shown in Table 2A.

TABLE 2A

| | Red phosphor (peak, half-width) | | |
|---|---|---|---|
| | SCASN (620 nm, 90 nm) | SCASN (630 nm, 90 nm) | CASN (660 nm, 90 nm) |
| Correlated color temperature | 3357 | 3357 | 3357 |
| Deviation duv from black-body radiation trajectory curve | −0.023 | −0.023 | −0.023 |
| Ra | 74 | 70 | 48 |
| R(9-12) | 50 | 35 | −11 |
| R9 | 75 | 35 | −114 |
| R9C * ab | 77 | 81 | 95 |

TABLE 2A-continued

| | Red phosphor (peak, half-width) | | |
|---|---|---|---|
| | SCASN (620 nm, 90 nm) | SCASN (630 nm, 90 nm) | CASN (660 nm, 90 nm) |
| R11C * ab | 44 | 46 | 52 |
| R12C * ab | 64 | 64 | 62 |
| R(1-14)C * ab (Ave.) | 40 | 41 | 44 |
| 600-780 nm integration ratio | 0.48 | 0.56 | 1.13 |
| 500 nm intensity ratio | 1.38 | 1.38 | 1.32 |
| 660 nm intensity ratio | 0.71 | 0.92 | 2.26 |

In Table 2A, SBCA2 is used as the blue phosphor, β-sialon is used as the green phosphor, and types of the red phosphor were changed. Table 2A shows that, by using a red phosphor with a long peak wavelength as the red phosphor, the 660 nm intensity ratio can be improved and the 600-780 nm integration ratio can be improved. Thus, it is understandable that chroma of red also improves accordingly.

(Relationship Among Narrow-Band Red Phosphor, Spectra, and Chroma)

In the present simulation, characteristics of light emitted by semiconductor light-emitting devices were evaluated by using a blue phosphor, a green phosphor, and a narrow-band red phosphor.

The results are shown in Table 2B.

TABLE 2B

| | Red phosphor (peak, half-width) Mn-activated germanate (660 nm, 16 nm) |
|---|---|
| Correlated color temperature | 3357 |
| Deviation duv from black-body radiation trajectory curve | −0.023 |
| R9C * ab | 106 |
| R11C * ab | 57 |
| R12C * ab | 64 |
| R(1-14)C * ab (Ave.) | 46 |
| 600-780 nm integration ratio | 0.98 |
| 500 nm intensity ratio | 1.41 |
| 660 nm intensity ratio | 6.81 |

In Table 2B, SBCA2 is used as the blue phosphor, β-sialon is used as the green phosphor, and Mn-activated germanate is used as the narrow-band red phosphor. Table 2B shows that, by using a narrow-band red phosphor as the red phosphor, the 500 nm intensity ratio can be improved and the 600-780 nm integration ratio can be improved. Accordingly, it is understandable that chroma of red also improves significantly.

(Relationship Among Green Phosphor, Blue Phosphor, Spectra, and Chroma)

In the present simulation, characteristics of light emitted by semiconductor light-emitting devices were evaluated by changing combinations of the blue phosphor and the green phosphor while keeping the red phosphor unchanged.

The results are shown in Table 3.

TABLE 3

| | Blue phosphor (peak, half-width) | | |
|---|---|---|---|
| | BAM (455 nm, 40 nm) | SBCA2 (475 nm, 70 nm) | SBCA2 (475 nm, 70 nm) |
| | Green phosphor (peak, half-width) | | |
| | BSS (530 nm, 70 nm) | BSS (530 nm, 70 nm) | β-SiAlON (540 nm, 50 nm) |
| Correlated color temperature | 3357 | 3357 | 3357 |
| Deviation duv from black-body radiation trajectory curve | −0.023 | −0.023 | −0.023 |
| Ra | 48 | 38 | 48 |
| R(9-12) | −6 | −34 | −11 |
| R9 | −114 | −139 | −114 |
| R9C * ab | 94 | 97 | 95 |
| R11C * ab | 54 | 56 | 52 |
| R12C * ab | 59 | 63 | 62 |
| R(1-14)C * ab (Ave.) | 44 | 45 | 44 |
| 600-780 nm integration ratio | 1.13 | 1.19 | 1.13 |
| 500 nm intensity ratio | 1.12 | 1.62 | 1.32 |
| 660 nm intensity ratio | 2.27 | 2.40 | 2.26 |

In Table 3, a CASN phosphor (peak wavelength: 660 nm, half-width: 90 nm) is used as the red phosphor and types of the blue phosphor and the green phosphor were changed. Table 3 shows that, by using a SBCA (SBCA2) phosphor instead of a BAM phosphor as the blue phosphor, the 500 nm intensity ratio can be improved, the 660 nm intensity ratio can be improved, and the 600-780 nm integration ratio can be improved. Thus, it is understandable that chroma also improves accordingly.

On the other hand, by using a BSS phosphor instead of β-sialon as the green phosphor, the 500 nm intensity ratio can be improved, the 660 nm intensity ratio can be improved, and the 600-780 nm integration ratio can be improved. Thus, it is understandable that chroma also improves accordingly.

Next, a result of a simulation for understanding a relationship among a deviation duv from a black-body radiation trajectory curve of light emitted by a semiconductor light-emitting device, spectra, and chroma will be described. With the semiconductor light-emitting device according to the present invention, a deviation duv from a black-body radiation trajectory curve of a chromaticity coordinate of light preferably satisfies a specific value at a desired correlated color temperature (specifically, 3357 K) and in an XY chromaticity diagram of a CIE (1931) XYZ color system. Specifically, the deviation duv is preferably −0.03 or more and 0.03 or less and more preferably −0.03 or more and 0.005 or less. It is understandable that, when the deviation duv satisfies the range described above, the semiconductor light-emitting device according to the present invention emits light with higher chroma.

(Relationship Among Deviation duv from Black-Body Radiation Trajectory Curve, Spectra, and Chroma)

In the present simulation, characteristics of light emitted by semiconductor light-emitting devices were evaluated by changing the deviation duv from black-body radiation trajectory curve while keeping chromaticity unchanged.

The results are shown in Table 4.

TABLE 4

| Correlated color temperature | 3357 | 3357 | 3357 | 3357 |
|---|---|---|---|---|
| Deviation duv from black-body radiation trajectory curve | 0.000 | −0.008 | −0.015 | −0.023 |
| Ra | 70 | 63 | 57 | 48 |
| R(9-12) | 53 | 32 | 14 | −11 |
| R9 | −41 | −68 | −87 | −114 |
| R9C * ab | 87 | 90 | 92 | 95 |
| R11C * ab | 45 | 47 | 49 | 52 |
| R12C * ab | 54 | 56 | 58 | 62 |
| R(1-14)C * ab (Ave.) | 41 | 42 | 43 | 44 |
| 600-780 nm integration ratio | 0.94 | 1.01 | 1.06 | 1.13 |
| 500 nm intensity ratio | 0.78 | 0.97 | 1.11 | 1.32 |
| 660 nm intensity ratio | 1.86 | 2.00 | 2.11 | 2.26 |

In Table 4, SBCA2 (peak wavelength: 475 nm, half-width: 70 nm) is used as the blue phosphor, β-sialon (peak wavelength: 540 nm, half-width: 50 nm) is used as the green phosphor, CASN (peak wavelength: 660 nm, half-width: 90 nm) is used as the red phosphor, and deviations duv from a black-body radiation trajectory curve were changed while keeping chromaticity unchanged. Table 4 shows that chroma and, in particular, chroma of red and green increase as duv changes from 0.000 to −0.023. From Table 4, it is understandable that numerical values of the 600-780 nm integration ratio, the 500 nm intensity ratio, and the 660 nm intensity ratio are all improved by reducing duv in a specific range and that the semiconductor light-emitting device according to the present invention emits light with higher chroma by setting duv to −0.03 or more and −0.005 or less.

Although the present invention will be more specifically described below using examples, it is to be understood that the present invention is not limited to these examples unless the present invention departs from the spirit of the invention.

<Test Samples>

Samples (semiconductor light-emitting device 1 of the present embodiment) for the test (including simulation) performed by the inventors of the present invention are described below.

In the present test, a violet light-emitting diode element with an emission peak wavelength of 405 nm and a half-width of 30 nm is used as the LED chip 10.

The emission peak wavelength and half-width are measured by using an integrating sphere.

In addition, in both the first and second examples, β-sialon is used as the green phosphor and CaAlSi(N,O)$_3$:Eu is used as the red phosphor. Moreover, the green phosphor has an emission peak wavelength of 540 nm and a half-width of 60 nm and the red phosphor has an emission peak wavelength of 660 nm and a half-width of 90 nm. As the blue phosphor, Sr$_5$(PO$_4$)$_3$Cl:Eu with a half-width of 30 nm and an emission peak wavelength of 450 nm is used in the first example, and (Sr$_{1-x}$Ba$_x$)$_5$(PO$_4$)$_3$Cl:Eu (x>0) with a half-width of 80 nm and an emission peak wavelength of 475 nm is used in the second example. Moreover, emission peak wavelengths and half-widths of the respective phosphors are values measured by a spectrophotometer.

The semiconductor light-emitting device 1 according to the first example emits light in which, at a desired correlated color temperature (specifically, 3357 K) and in an XY chromaticity diagram of a CIE (1931) XYZ color system, a deviation duv from a black-body radiation trajectory curve (hereinafter, simply referred to as duv) of a chromaticity coordinate of light has a desired value. Moreover, while the desired duv value is preferably −0.02 or more and 0.02 or less (in other words, white), the desired duv value may be −0.03 or more and 0.02 or less or −0.02 or more and 0.03 or less (in other words, other than white). Alternatively, the desired duv value may be 0.00 or more and 0.03 or less or 0.02 or more and 0.03 or less. In a similar manner, the desired duv value may be −0.03 or more and 0.00 or less or −0.03 or more and −0.02 or less. In addition, as is understandable from the result of the simulation described above, the desired duv value is preferably −0.005 or less, more preferably −0.010 or less, and particularly preferably −0.020 or less. Furthermore, since luminous efficiency declines significantly when the desired duv value is less than −0.030, the desired duv value is preferably −0.030 or more. Chroma, and in particular, chroma of red and green can be increased if the duv value is within the ranges described above. In the first example, duv is set to −0.0233.

In addition, with the light in the first example, with respect to a value of an energy area of light with a wavelength of 600 nm or more and 780 nm or less among a spectrum of reference light normalized with respect to luminous flux for color rendering evaluation, a value of an energy area of light with a wavelength of 600 nm or more and 780 nm or less among a spectrum of light normalized with respect to luminous flux is 85% or more, preferably 90% or more, more preferably 101% or more, particularly preferably 106% or more, and 150% or less, preferably 130% or less, more preferably 125% or less, even more preferably 117% or less, and particularly preferably 115% or less (in the first example of the present embodiment, 970).

Furthermore, with the light in the first example, with respect to a value of intensity of light with a wavelength of 660 nm in a spectrum of reference light normalized with respect to luminous flux for color rendering evaluation, a value of intensity of light with a wavelength of 660 nm in a spectrum of light normalized with respect to luminous flux is 170% or more, preferably 180% or more, more preferably 190% or more, even more preferably 210% or more, particularly preferably 218% or more, and 300% or less, preferably 260% or less, more preferably 250% or less, even more preferably 240% or less, and particularly preferably 230% or less (in the first example of the present embodiment, 193%).

Figure 2:
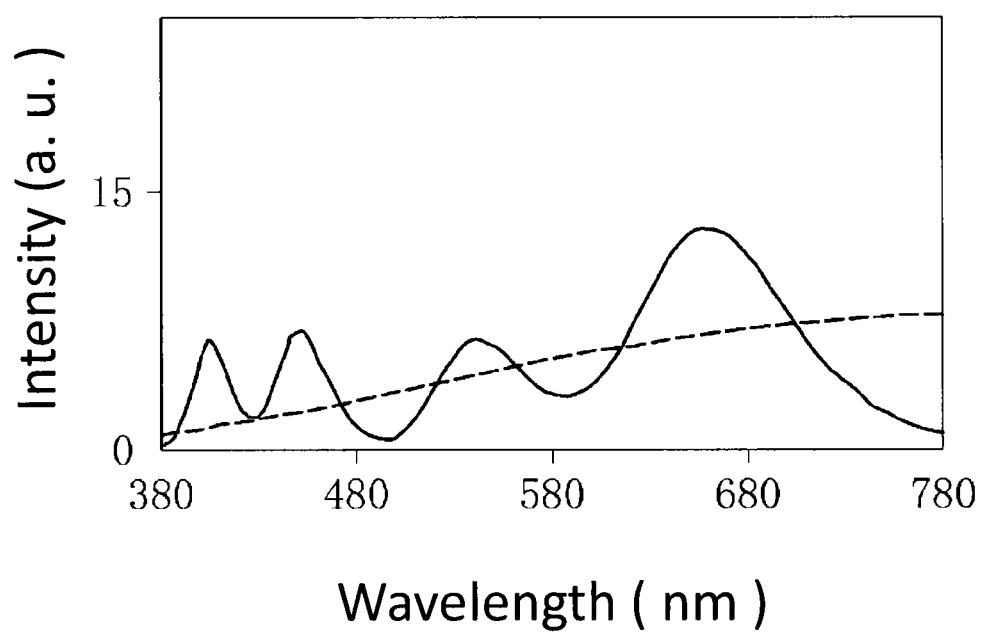
FIG. 2 is a graph showing a spectrum of synthetic light emitted by a semiconductor light-emitting device according to a first example.

FIG. 2 is a graph which shows a spectrum of the synthetic light that semiconductor light emitting device 1 of the first embodiment emitted.

In FIG. 2, a spectrum of the synthetic light emitted by the semiconductor light-emitting device 1 according to the first example is represented by a solid line and a spectrum of a reference light for color rendering evaluation corresponding to a correlated color temperature of the synthetic light is represented by a dotted line. Moreover, a value of peak intensity of excitation light that is light emitted by the LED chip 10 is adjusted so as to be a value that is 50% of a largest value among values of peak intensities of respective fluorescences that are light emitted by the respective phosphors. In addition, the synthetic light emitted by the semiconductor light-emitting device 1 is light including the excitation light emitted by the LED chip 10 and the respective fluorescences emitted by the respective phosphors.

The semiconductor light-emitting device 1 according to the second example emits light with a desired correlated color temperature (specifically, 3357 K) and a desired duv value in a similar manner to the semiconductor light-emitting device 1 according to the first example. Moreover, in a similar manner to the first example, while the desired duv value is preferably −0.02 or more and 0.02 or less (in other words, white), the desired duv value may be −0.03 or more and 0.02 or less or −0.02 or more and 0.03 or less (in other words, other than white). Alternatively, the desired duv value may be 0.00 or more and 0.03 or less or 0.02 or more and 0.03 or less. In a similar manner, the desired duv value may be −0.03 or more and 0.00 or less or −0.03 or more and −0.02 or less. In addition, the desired duv value is preferably −0.005 or less, more preferably −0.010 or less, and particularly preferably −0.020 or less. Furthermore, since luminous efficiency declines significantly when the desired duv value is less than −0.030, the desired duv value is preferably −0.030 or more. Chroma, and in particular, chroma of red and green can be increased if the duv value is within the ranges described above. In the second example, duv is set to −0.0233 in a similar manner to the first example.

In addition, with the light in the second example, with respect to a value of an energy area of light with a wavelength of 600 nm or more and 780 nm or less among a spectrum of reference light normalized with respect to luminous flux for color rendering evaluation, a value of an energy area of light with a wavelength of 600 nm or more and 780 nm or less among a spectrum of light normalized with respect to luminous flux is 85% or more, preferably 90% or more, more preferably 101% or more, particularly preferably 106% or more, and 150% or less, preferably 130% or less, more preferably 125% or less, even more preferably 117% or less, and particularly preferably 115% or less (in the second example of the present embodiment, 113%). Furthermore, a value of intensity of light with a wavelength of 500 nm in a spectrum of light normalized with respect to luminous flux is 132% of a value of intensity of light with a wavelength of 500 nm in a spectrum of reference light normalized with respect to luminous flux for color rendering evaluation.

Furthermore, with the light in the second example, with respect to a value of intensity of light with a wavelength of 660 nm in a spectrum of reference light normalized with respect to luminous flux for color rendering evaluation, a value of intensity of light with a wavelength of 660 nm in a spectrum of light normalized with respect to luminous flux is 170% or more, preferably 180% or more, more preferably 190% or more, even more preferably 210% or more, particularly preferably 218% or more, and 300% or less, preferably 260% or less, more preferably 250% or less, even more preferably 240% or less, and particularly preferably 230% or less (in the second example of the present embodiment, 2260).

Figure 3:
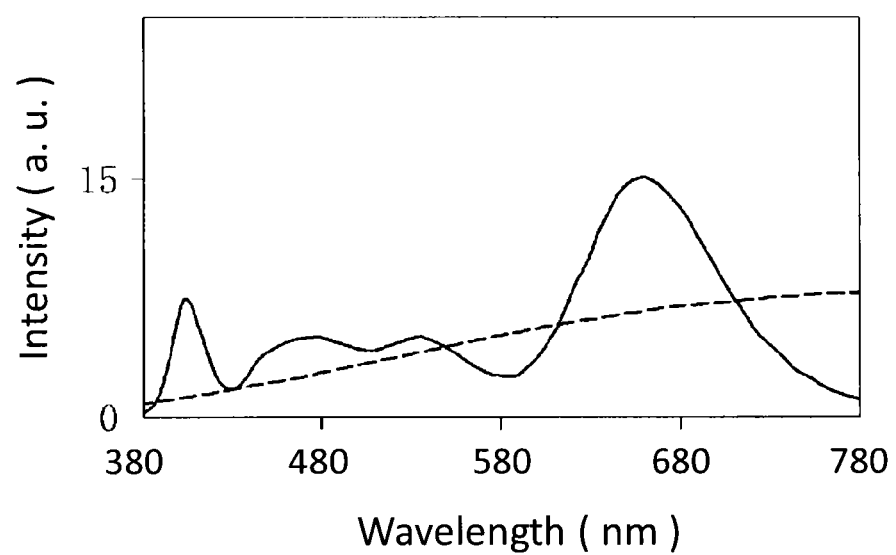
FIG. 3 is a graph showing a spectrum of synthetic light emitted by a semiconductor light-emitting device according to a second example.

FIG. 3 is a graph which shows a spectrum of the synthetic light that semiconductor light emitting device 1 of the second embodiment emitted.

In FIG. 3, a spectrum of the synthetic light emitted by the semiconductor light-emitting device 1 according to the second example is represented by a solid line and a spectrum of a reference light for color rendering evaluation corresponding to a correlated color temperature of the synthetic light is represented by a dotted line. Moreover, the LED chip 10 is adjusted so that a value of peak intensity of excitation light that is light emitted by the LED chip 10 is a value that is 50% of a largest value among values of peak intensities of respective fluorescences that are light emitted by the respective phosphors.

<Experimental Result>

FIG. 4 is a table showing characteristics of light emitted in the first example, the second example, a first reference example, a second reference example, a third reference example, and a fourth reference example. Moreover, characteristics of light in the first reference example are calculated based on the spectral energy distribution chart described in Non-Patent Document 1. In addition, characteristics of light in the second reference example is calculated based on characteristics of a reference light for color rendering evaluation at a same correlated color temperature (3357 K) as the first and second examples. Characteristics of light in the third reference example are characteristics of light emitted by sample V-1 described in Patent Document 3 as obtained by simulation. Characteristics of light in the fourth reference example are characteristics of light emitted by sample V-7 described in Patent Document 3 as obtained by simulation.

In the table shown in FIG. 4, "C*ab of R9", "C*ab of R11", and "C*ab of R12" respectively represent C*ab of a test color with a special color rendering index of R9, C*ab of a test color with R11, and C*ab of a test color with R12. In addition, C*ab (Ave.) of R1 to R14 represents an average value of C*ab values of the respective test colors with special color rendering indices of R1 to R14. In the present embodiment, an evaluation based on an average value of C*ab values of respective test colors with special color rendering indices of R1 to R14 is performed instead of an evaluation based on an average color rendering index Ra because an object of the present invention is to provide a semiconductor light-emitting device 1 that emits light with high chroma, and whether or not chroma of emitted light is high or not can be more appropriately evaluated by using an average value of C*ab values of respective test colors with special color rendering indices of R1 to R14 including the special color rendering indices of R9, R11, and R12 instead of using an average color rendering index Ra.

Since the present invention has been made with a focus on chroma, evaluations of the respective examples are preferably performed based on evaluation criteria which are as close to human perception as possible. However, a distance between two points on a CIE xy chromaticity diagram does not correspond to a perceptual distance at a same luminance. A three-dimensional color space which includes a light-dark dimension and which takes perceptual distance into consideration is referred to as a uniform color space and is a representation system which is close to human perception as possible.

In addition, a CIE 1976 color space (also referred to as a CIELab color space) is a representation of color as a coordinate on a uniform color space defined by lightness L* and a chromanetics index a*·b*, and a calculation formula is defined based on human color perception. In a CIELab color space prescribed in JIS Z 8729, chroma (metric chroma) is calculated using a*·b* according to $$C^*ab = (a^{*2} + b^{*2})^{(1/2)}.$$ Expression (2).

In the present embodiment, in order to evaluate chroma based on evaluation criteria which is close to human perception as possible, chroma when irradiating each light on an irradiated subject in accordance with each color rendering index is calculated using Expression (2) above and compared with each other.

In addition, in the table shown in FIG. 4, an energy area is described as a percentage value of a value obtained by dividing an integral value of a spectral radiant flux with a wavelength of 600 nm or more and 780 nm or less by total flux in each example with respect to a value obtained by dividing an integral value of a spectral radiant flux with a wavelength of 600 nm or more and 780 nm or less of a reference light for color rendering evaluation by total flux. A 500 nm intensity ratio is a percentage value of a ratio of intensity at a wavelength of 500 nm in each example with respect to intensity of a reference light for color rendering evaluation at a wavelength of 500 nm. A 660 nm intensity ratio is a percentage value of a ratio of intensity at a wavelength of 660 nm in each example with respect to intensity of a reference light for color rendering evaluation at a wavelength of 660 nm.

As shown in FIG. 4, the semiconductor light-emitting device 1 according to the first example emits light with a C*ab value of 87.3 regarding a test color with a special color rendering index of R9. Since the special color rendering index of R9 corresponds to vivid red, it is found that the semiconductor light-emitting device 1 according to the first example emits light with a higher chroma regarding vivid red as compared to the first reference example having a C*ab value of 84.5 regarding a test color with a special color rendering index of R9, the second reference example having a C*ab value of 73.3, the third reference example having a C*ab value of 72.9, and the fourth reference example having a C*ab value of 86.3. In addition, since the semiconductor light-emitting device 1 according to the second example emits light with a C*ab value of 94.7 regarding a test color with a special color rendering index of R9, it is found that the semiconductor light-emitting device 1 according to the second example emits vivid red light with even higher chroma regarding vivid red.

As shown in FIG. 4, the semiconductor light-emitting device 1 according to the first example emits light with a C*ab value of 45.2 regarding a test color with a special color rendering index of R11. Since the special color rendering index of R11 corresponds to vivid green, it is found that the semiconductor light-emitting device 1 according to the first example emits light with a higher chroma regarding vivid green as compared to the second reference example having a C*ab value of 38.4 regarding a test color with a special color rendering index of R11, the third reference example having a C*ab value of 37.9, and the fourth reference example having a C*ab value of 45.1, and emits light with a higher chroma regarding vivid green which is comparable to the first reference example having a C*ab value of 46.4. In addition, since the semiconductor light-emitting device 1 according to the second example emits light with a C*ab value of 51.9 regarding a test color with a special color rendering index of R11, it is found that the semiconductor light-emitting device 1 according to the second example emits light with even higher chroma regarding vivid green.

As shown in FIG. 4, the semiconductor light-emitting device 1 according to the first example emits light with a C*ab value of 57.7 regarding a test color with a special color rendering index of R12. Since the special color rendering index of R12 corresponds to vivid blue, it is found that the semiconductor light-emitting device 1 according to the first example emits light with a higher chroma regarding vivid blue as compared to the first reference example having a C*ab value of 52.9 regarding a test color with a special color rendering index of R12, the second reference example having a C*ab value of 55.6, the third reference example having a C*ab value of 55.3, and the fourth reference example having a C*ab value of 57.2. In addition, since the semiconductor light-emitting device 1 according to the second example emits light with a C*ab value of 61.6 regarding a test color with a special color rendering index of R12, it is found that the semiconductor light-emitting device 1 according to the second example emits light with even higher chroma regarding vivid blue.

As shown in FIG. 4, the semiconductor light-emitting device 1 according to the first example emits light with an average value of 43.6 of C*ab values regarding respective test colors with special color rendering indices of R1 to R14. Therefore, it is found that the semiconductor light-emitting device 1 according to the first example emits light with higher chroma regarding the respective test colors with special color rendering indices of R1 to R14 as compared to the first reference example having an average value of 42.6 of C*ab values regarding respective test colors with special color rendering indices of R1 to R14, the second reference example having an average value of 38.2, the third reference example having an average value of 38.7, and the fourth reference example having an average value of 40.9. In addition, since the semiconductor light-emitting device 1 according to the second example emits light with an average value of 44.0 of C*ab values regarding respective test colors with special color rendering indices of R1 to R14, it is found that the semiconductor light-emitting device 1 according to the second example emits light with even higher chroma.

Moreover, the semiconductor light-emitting device 1 according to the first example has a lower value of the average color rendering index Ra of 69, and the semiconductor light-emitting device 1 according to the second example has an even lower value of the average color rendering index Ra of 48. As described in Patent Document 3, with a conventional semiconductor light-emitting device, a value of the average color rendering index Ra is increased for the purpose of enhancing color reproducibility. However, the color rendering property of the semiconductor light-emitting device according to the present invention does not necessarily require a high value of the average color rendering index Ra and, instead, places importance on high chroma.

In addition, as shown in FIG. 4, the energy area of the semiconductor light-emitting device 1 according to the first example is 97% with respect to a range of 85% or more and 150% or less. Furthermore, the energy area of the semiconductor light-emitting device 1 according to the second example is 113% with respect to a range of 85% or more and 150% or less.

As shown in FIG. 4, the 500 nm intensity ratio of the semiconductor light-emitting device 1 according to the first example is 22%. In addition, the 500 nm intensity ratio of the semiconductor light-emitting device 1 according to the second example is 132%. Therefore, the 500 nm intensity ratio of the semiconductor light-emitting device 1 according to the first example and the 500 nm intensity ratio of the semiconductor light-emitting device 1 according to the second example are both 15% or more and 200% or less, and the 500 nm intensity ratio of the semiconductor light-emitting device 1 according to the second example is 110% or more and 200% or less.

As shown in FIG. 4, the 660 nm intensity ratio of the semiconductor light-emitting device 1 according to the first example is 193%. In addition, the 660 nm intensity ratio of the semiconductor light-emitting device 1 according to the second example is 226%. Therefore, the 660 nm intensity ratios of the semiconductor light-emitting devices 1 according to the first and second examples are 170% or more and 300% or less.

FIG. 5 is a table showing changes in characteristics calculated based on synthetic spectra created by combining a emission spectrum normalized with respect to luminous flux of the semiconductor light-emitting device 1 according to the first example with a emission spectrum normalized with respect to luminous flux of the semiconductor light-emitting device 1 according to the second example at various ratios. In FIG. 5, for example, a column in which the "ratio of the first example" is 0.5 and the "ratio of the second example" is 0.5 represents characteristics of a simulated semiconductor light-emitting device 1 having, as a spectrum of output light, a synthetic spectrum created by combining a emission spectrum normalized with respect to luminous flux of the semiconductor light-emitting device 1 according to the first example with a emission spectrum normalized with respect to luminous flux of the semiconductor light-emitting device 1 according to the second example at a ratio of 5:5. As shown in FIG. 5, a mixing ratio of the emission spectrum of the semiconductor light-emitting device 1 according to the first example and the emission spectrum of the semiconductor light-emitting device 1 according to the second example are changed in stages from 1.0:0.0 to 0.0:1.0.

Figure 6:
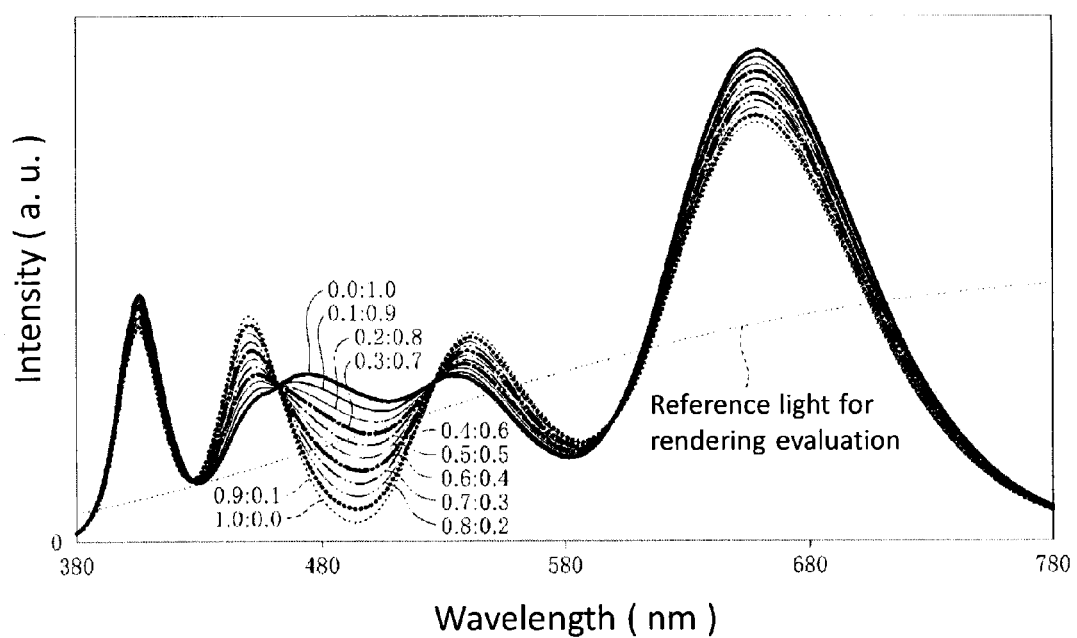
FIG. 6 is a graph showing a change in emission spectra when changing a mixing ratio that is a ratio at which an emission spectrum of the semiconductor light-emitting device according to the first example and an emission spectrum of the semiconductor light-emitting device according to the second example are mixed.

FIG. 6 is a graph showing a change in emission spectra when changing a mixing ratio that is a ratio at which an emission spectrum of the semiconductor light-emitting device 1 according to the first example and an emission spectrum of the semiconductor light-emitting device 1 according to the second example are mixed. In FIG. 6, an emission spectrum when a mixing ratio of the emission spectrum of the semiconductor light-emitting device 1 according to the first example and the emission spectrum of the semiconductor light-emitting device 1 according to the second example is 1.0:0.0 (in other words, a spectrum of a synthetic light according to the first example) is indicated by an intermediate dotted line, an emission spectrum corresponding to 0.9:0.1 is indicated by a thick dotted line, an emission spectrum corresponding to 0.8:0.2 is indicated by a thin dashed-two dotted line, an emission spectrum corresponding to 0.7:0.3 is indicated by an intermediate dashed-two dotted line, an emission spectrum corresponding to 0.6:0.4 is indicated by a thick dashed-two dotted line, an emission spectrum corresponding to 0.5:0.5 is indicated by a thin dashed-dotted line, an emission spectrum corresponding to 0.4:0.6 is indicated by an intermediate dashed-dotted line, an emission spectrum corresponding to 0.3:0.7 is indicated by a thick dashed-dotted line, an emission spectrum corresponding to 0.2:0.8 is indicated by a thin solid line, an emission spectrum corresponding to 0.1:0.9 is indicated by an intermediate solid line, an emission spectrum corresponding to 0.0:1.0 (in other words, a spectrum of a synthetic light according to the second example) is indicated by a thick solid line, and an emission spectrum of a reference light for color rendering evaluation is indicated by a thin dotted line. As shown in FIG. 6, emission spectra change in accordance with changes in the mixing ratio.

As shown in FIG. 5, C*ab values regarding test colors with special color rendering indices of R9, R11, and R12 tend to increase as the mixing ratio of the emission spectrum of the semiconductor light-emitting device 1 according to the second example increases. In particular, C*ab values regarding test colors with special color rendering indices of R9 and R11 monotonically increase as the mixing ratio of the emission spectrum of the semiconductor light-emitting device 1 according to the second example increases. Therefore, it is found that by increasing the mixing ratio of the emission spectrum of the semiconductor light-emitting device 1 according to the second example, respective chroma of vivid red, vivid green, and vivid blue in emitted light can be increased. Between the semiconductor light-emitting device 1 according to the first example and the semiconductor light-emitting device 1 according to the second example, although the same green phosphor and red phosphor are used, since compositions and emission characteristics of the blue phosphors used differ from each other, changing the mixing ratio of the emission spectrum of the semiconductor light-emitting device 1 according to the first example and the emission spectrum of the semiconductor light-emitting device 1 according to the second example may be restated as changing a mixing ratio of $Sr_5(PO_4)_3Cl:Eu$ and $(Sr_{1-x}Ba_x)_5(PO_4)_3Cl:Eu$ (x>0) contained in the simulated semiconductor light-emitting device 1. In other words, increasing the mixing ratio of the emission spectrum of the semiconductor light-emitting device 1 according to the second embodiment is equivalent to increasing the mixing ratio of $(Sr_{1-x}Ba_x)_5(PO_4)_3Cl:Eu$ (x>0)

and, as a result, chroma of vivid red, vivid green, and vivid blue of the emitted light can be increased.

In addition, as shown in FIG. 5, the average value of C*ab values regarding test colors with special color rendering indices of R1 to R14 monotonically increases as the mixing ratio of the emission spectrum of the semiconductor light-emitting device 1 according to the second example increases. Therefore, it is found that by increasing the mixing ratio of the blue phosphor used in the semiconductor light-emitting device 1 according to the second example, chroma of respective test colors with special color rendering indices of R1 to R14 of the emitted light can be increased.

As shown in FIG. 5, energy area, 500 nm intensity ratio, and 660 nm intensity ratio respectively increase monotonically as the mixing ratio of the blue phosphor used in the semiconductor light-emitting device 1 according to the second example increases. In this case, as shown in FIG. 5, the 660 nm intensity ratio increases as the 500 nm intensity ratio increases. The reason therefor will be described.

Since changing chromaticity when changing a spectrum of a light source in order to increase chroma causes a change in a spectrum of the reference light for color rendering evaluation and therefore complicates drawing a comparison between before and after the change, a case will now be described in which the spectrum of a light source is changed so that chromaticity remains constant before and after the change.

As described earlier, chromaticity is calculated based on three spectral sensitivities (color-matching functions) corresponding to the human eye. The three spectral sensitivities are constituted by $x(\lambda)$, $y(\lambda)$, and $z(\lambda)$, and chromaticity is calculated in accordance with a proportion of respective stimuli (a proportion of values of spectral sensitivities) upon incidence of light on an eye. Therefore, keeping chromaticity of light constant means keeping a ratio of values of spectral sensitivities of light constant. Moreover, spectral sensitivity (color-matching function) is defined by the CIE (Commission Internationale de l'Eclairage) as an color-matching function of a standard colorimetric observer (hereinafter referred to as CIE 1931) and an color-matching function of a supplementary standard colorimetric observer (hereinafter referred to as CIE 1964).

According to CIE 1931 and CIE 1964, among the spectral sensitivities at the 660 nm wavelength, values of $x(\lambda)$ and $y(\lambda)$ are greater than the value of $z(\lambda)$. In addition, since a comparison between the value of $x(\lambda)$ and the value of $y(\lambda)$ at the 660 nm wavelength shows that the value of $x(\lambda)$ is greater, spectra of $y(\lambda)$ and $z(\lambda)$ of light must be adjusted to change spectra while keeping the chromaticity of the light constant. While it is possible to adjust the spectra of $y(\lambda)$ and $z(\lambda)$ with a plurality of monochromatic light, the values of $y(\lambda)$ and $z(\lambda)$ must be changed without changing the value of $x(\lambda)$ when considering that the spectra of $y(\lambda)$ and $z(\lambda)$ are to be adjusted only by using a monochromatic light of a given wavelength.

Furthermore, CIE 1931 and CIE 1964 show that light with a wavelength of 500 nm can be used as such light (in other words, light that enables values of $y(\lambda)$ and $z(\lambda)$ to be changed without changing the value of $x(\lambda)$). Therefore, if the intensity of a component of light with a wavelength of 500 nm changes, the intensity of a component of light with a wavelength of 660 nm changes while keeping chromaticity of light unchanged. In other words, when the 500 nm intensity ratio is increased without changing the chromaticity of light, the 660 nm intensity ratio is also increased.

Figure 7:
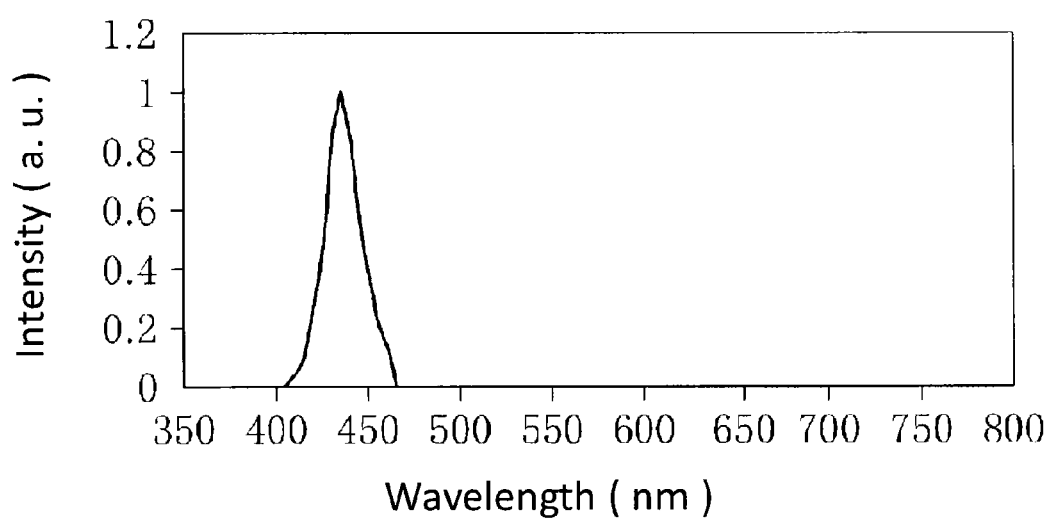
FIG. 7 is a graph showing spectral reflectance characteristics in which light with a wavelength in a vicinity of a mercury emission line with a wavelength of 435 nm is more intensely reflected than light with other wavelengths.
Figure 8:
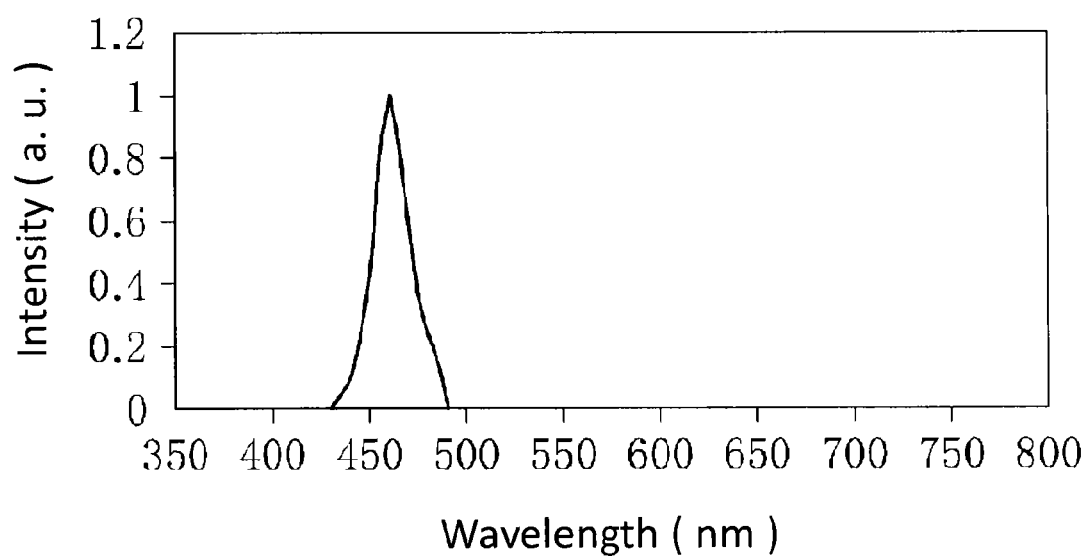
FIG. 8 is a graph showing spectral reflectance characteristics in which light with a wavelength in a vicinity of 460 nm is more intensely reflected than light with other wavelengths.

FIGS. 7 and 8 respectively illustrate spectral reflectance characteristics, and compare chroma in cases where an irradiated subject having the illustrated spectral reflectance characteristics is irradiated by light according to the first reference example described earlier, irradiated by light according to the fifth reference example which is light having the characteristics shown in the spectral energy distribution chart described in FIG. 1 of Patent Document 1, irradiated by light according to the sixth reference example which is light having the characteristics shown in the spectral energy distribution chart described in FIG. 3 of Patent Document 1, and irradiated by synthetic light emitted by the semiconductor light-emitting device 1 according to the second example.

FIG. 7 is a graph showing spectral reflectance characteristics in which light with a wavelength in a vicinity of a mercury emission line with a wavelength of 435 nm (an intense narrow-band light with a wavelength around 435 nm which is created due to an irradiation source of light containing mercury; linearly depicted in a spectral energy distribution chart) is more intensely reflected than light with other wavelengths.

In addition, according to the simulation, the chroma C*ab when light according to the first reference example which is light having the characteristics shown in the spectral energy distribution chart described in Non-Patent Document 1 is irradiated on the irradiated subject having the spectral reflectance characteristics shown in FIG. 7 is 162.6. In addition, according to the simulation, the chroma C*ab when reference light for color rendering evaluation with a same correlated color temperature as the light according to the first reference example is irradiated on the irradiated subject having the spectral reflectance characteristics shown in FIG. 7 is 141.8. Consequently, relative chroma when light according to the first reference example which is light having the characteristics shown in the spectral energy distribution chart described in Non-Patent Document 1 is irradiated on the irradiated subject having the spectral reflectance characteristics shown in FIG. 7 is 115%.

Moreover, relative chroma refers to a percentage of a ratio of chroma C*ab when a given light is irradiated on a given irradiated subject regarding chroma C*ab when reference light for color rendering evaluation with a same correlated color temperature as the given light is irradiated on the given irradiated subject.

According to the simulation, the chroma C*ab when light according to the fifth reference example is irradiated on the irradiated subject having the spectral reflectance characteristics shown in FIG. 7 is 174.8. In addition, according to the simulation, the chroma C*ab when reference light for color rendering evaluation with a same correlated color temperature as the light according to the fifth reference example is irradiated on the irradiated subject having the spectral reflectance characteristics shown in FIG. 7 is 126.9. Consequently, the relative chroma when light according to the fifth reference example is irradiated on the irradiated subject having the spectral reflectance characteristics shown in FIG. 7 is 138%.

According to the simulation, the chroma C*ab when light according to the sixth reference example is irradiated on the irradiated subject having the spectral reflectance characteristics shown in FIG. 7 is 178.4. In addition, according to the simulation, the chroma C*ab when reference light for color rendering evaluation with a same correlated color temperature as the light according to the sixth reference example is irradiated on the irradiated subject having the spectral reflectance characteristics shown in FIG. 7 is 129.4. Consequently, the relative chroma when light according to the sixth reference example is irradiated on the irradiated subject having the spectral reflectance characteristics shown in FIG. 7 is 138%.

According to the simulation, the chroma C*ab when synthetic light emitted by the semiconductor light-emitting device 1 according to the second example is irradiated on the irradiated subject having the spectral reflectance characteristics shown in FIG. 7 is 113.9. In addition, according to the simulation, the chroma C*ab when reference light for color rendering evaluation with a same correlated color temperature as the synthetic light emitted by the semiconductor light-emitting device 1 according to the second example is irradiated on the irradiated subject having the spectral reflectance characteristics shown in FIG. 7 is 136.5. Consequently, the relative chroma when synthetic light emitted by the semiconductor light-emitting device 1 according to the second example is irradiated on the irradiated subject having the spectral reflectance characteristics shown in FIG. 7 is 83%.

FIG. 8 is a graph showing spectral reflectance characteristics in which monochromatic light with a wavelength in a vicinity of 460 nm is more intensely reflected than light with other wavelengths.

In addition, according to the simulation, the chroma C*ab when light according to the first reference example which is light having the characteristics shown in the spectral energy distribution chart described in Non-Patent Document 1 is irradiated on the irradiated subject having the spectral reflectance characteristics shown in FIG. 8 is 80.3. In addition, according to the simulation, the chroma C*ab when reference light for color rendering evaluation with a same correlated color temperature as the light according to the first reference example is irradiated on the irradiated subject having the spectral reflectance characteristics shown in FIG. 8 is 112.7. Consequently, relative chroma when light according to the first reference example which is light having the characteristics shown in the spectral energy distribution chart described in Non-Patent Document 1 is irradiated on the irradiated subject having the spectral reflectance characteristics shown in FIG. 8 is 71%.

According to the simulation, the chroma C*ab when light according to the fifth reference example is irradiated on the irradiated subject having the spectral reflectance characteristics shown in FIG. 8 is 78.3. In addition, according to the simulation, the chroma C*ab when reference light for color rendering evaluation with a same correlated color temperature as the light according to the fifth reference example is irradiated on the irradiated subject having the spectral reflectance characteristics shown in FIG. 8 is 113.1. Consequently, the relative chroma when light according to the fifth reference example is irradiated on the irradiated subject having the spectral reflectance characteristics shown in FIG. 8 is 69%.

According to the simulation, the chroma C*ab when light according to the sixth reference example is irradiated on the irradiated subject having the spectral reflectance characteristics shown in FIG. 8 is 79.4. In addition, according to the simulation, the chroma C*ab when reference light for color rendering evaluation with a same correlated color temperature as the light according to the sixth reference example is irradiated on the irradiated subject having the spectral reflectance characteristics shown in FIG. 8 is 112.9. Consequently, the relative chroma when light according to the sixth reference example is irradiated on the irradiated subject having the spectral reflectance characteristics shown in FIG. 8 is 70%.

According to the simulation, the chroma C*ab when synthetic light emitted by the semiconductor light-emitting device 1 according to the second example is irradiated on the irradiated subject having the spectral reflectance characteristics shown in FIG. 8 is 98.3. In addition, according to the simulation, the chroma C*ab when reference light for color rendering evaluation with a same correlated color temperature as the synthetic light emitted by the semiconductor light-emitting device 1 according to the second example is irradiated on the irradiated subject having the spectral reflectance characteristics shown in FIG. 8 is 112.6. Consequently, the relative chroma when synthetic light emitted by the semiconductor light-emitting device 1 according to the second example is irradiated on the irradiated subject having the spectral reflectance characteristics shown in FIG. 8 is 87%.

FIG. 9 is a table showing relative chroma when light according to the respective examples is irradiated on an irradiated subject having the spectral reflectance characteristics shown in FIG. 7, relative chroma when light according to the respective examples is irradiated on an irradiated subject having the spectral reflectance characteristics shown in FIG. 8, and a rate of change in relative chroma in accordance with the irradiated subjects.

As shown in FIG. 9, light according to the first reference example, light according to the fifth reference example, and light according to the sixth reference example exhibit high relative chroma when irradiated on an irradiated subject having the spectral reflectance characteristics shown in FIG. 7 but exhibit low relative chroma when irradiated on an irradiated subject having the spectral reflectance characteristics shown in FIG. 8. Therefore, light according to the first reference example, light according to the fifth reference example, and light according to the sixth reference example have a high rate of change of relative chroma in accordance with the irradiated subjects. Specifically, with the light according to the first reference example, relative chroma when irradiated on an irradiated subject having the spectral reflectance characteristics shown in FIG. 7 is 162% of relative chroma when irradiated on an irradiated subject having the spectral reflectance characteristics shown in FIG. 8. In addition, with the light according to the fifth reference example, relative chroma when irradiated on an irradiated subject having the spectral reflectance characteristics shown in FIG. 7 is 200% of relative chroma when irradiated on an irradiated subject having the spectral reflectance characteristics shown in FIG. 8. With the light according to the sixth reference example, relative chroma when irradiated on an irradiated subject having the spectral reflectance characteristics shown in FIG. 7 is 197% of relative chroma when irradiated on an irradiated subject having the spectral reflectance characteristics shown in FIG. 8.

This means that with light emitted by a fluorescent lamp having a mercury emission line in a spectral energy distribution chart, chroma changes significantly in accordance with spectral reflectance characteristics of irradiated subjects. In particular, a difference in relative chroma ranges from 162% to 200% (in other words, differs by a factor ranging from 1.6 to 2.0) between an irradiated subject having spectral reflectance characteristics in which a wavelength of a mercury emission line is intensely reflected and an irradiated subject having spectral reflectance characteristics in which wavelengths other than the wavelength of a mercury emission line are intensely reflected.

In contrast, with the synthetic light emitted by the semiconductor light-emitting device 1 according to the second example, as shown in FIG. 9, a difference between relative chroma in a case where the synthetic light is irradiated on an irradiated subject having the spectral reflectance characteristics shown in FIG. 7 and relative chroma in a case where the synthetic light is irradiated on an irradiated subject having the spectral reflectance characteristics shown in FIG. 8 is small. Therefore, with the synthetic light emitted by the semiconductor light-emitting device 1 according to the second example, a rate of change of relative chroma in accordance with irradiated subjects is small. Specifically, with the synthetic light emitted by the semiconductor light-emitting device 1 according to the second example, relative chroma when irradiated on an irradiated subject having the spectral reflectance characteristics shown in FIG. 7 is 95% of relative chroma when irradiated on an irradiated subject having the spectral reflectance characteristics shown in FIG. 8.

In other words, as is the case with the semiconductor light-emitting device 1 according to the second example, when a mercury emission line is not present in the spectral energy distribution chart and a broadband phosphor is used, a rate of change of chroma based on spectral reflectance characteristics of the irradiated subjects is small. This also applies to the semiconductor light-emitting device 1 according to the first example.

Next, specimens actually prepared by the present inventors will be described. A 350 μm square InGaN violet light-emitting diode element with an emission peak wavelength of approximately 405 nm and a half-width of approximately 30 nm was used as the LED chip 10.

The emission peak wavelength and half-width are measured by using an integrating sphere.

β-sialon is used as the green phosphor, $CaAlSi(N,O)_3$:Eu is used as the red phosphor, and $(Sr_{1-x}Ba_x)_5(PO_4)_3Cl$:Eu (x>0) is used as the blue phosphor. Moreover, the green phosphor has an emission peak wavelength of 540 nm and a half-width of 60 nm, the red phosphor has an emission peak wavelength of 660 nm and a half-width of 90 nm, and the blue phosphor has an emission peak wavelength of 475 nm and a half-width of 80 nm.

The emission peak wavelength and half-width of each phosphor are measured by a spectrophotometer.

All semiconductor light-emitting devices are prepared by mounting six of the violet light-emitting diode elements on a 5050 SMD alumina ceramic package and encapsulating the package using a silicone resin composition having a powder phosphor added thereto. FIG. 10 is a table showing contents (weight percent concentration) of respective phosphors in silicone resin compositions for encapsulating the light-emitting diode elements used in the respective semiconductor light-emitting devices. As shown in FIG. 10, the semiconductor light-emitting device 1 according to a third example is structured such that the violet light-emitting diode elements are encapsulated by a silicone resin composition containing, at a concentration of 19.4 wt %, a phosphor mixture which contains blue phosphor, green phosphor, and red phosphor at respective concentrations of 14.4 wt %, 2.5 wt %, and 2.5 wt %. In addition, as shown in FIG. 10, the semiconductor light-emitting device 1 according to a fourth example is structured such that the violet light-emitting diode elements are encapsulated by a silicone resin composition containing, at a concentration of 18.7 wt %, a phosphor mixture which contains blue phosphor, green phosphor, and red phosphor at respective concentrations of 13.0 wt %, 3.8 wt %, and 1.9 wt %.

Figure 11:
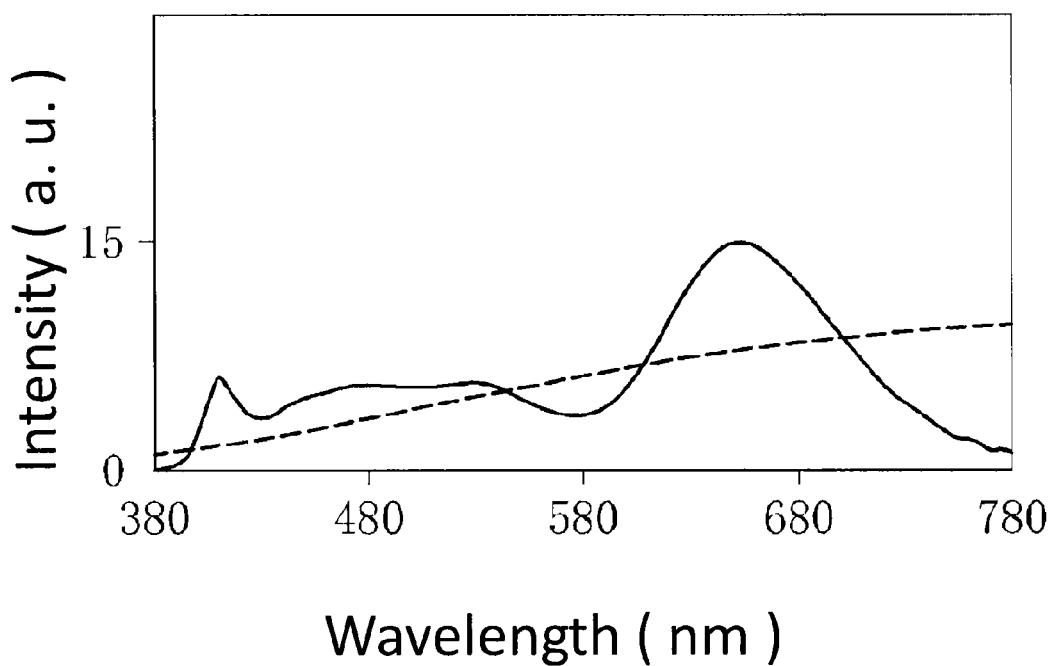
FIG. 11 is a graph of an emission spectrum of a semiconductor light-emitting device according to a third example.
Figure 12:
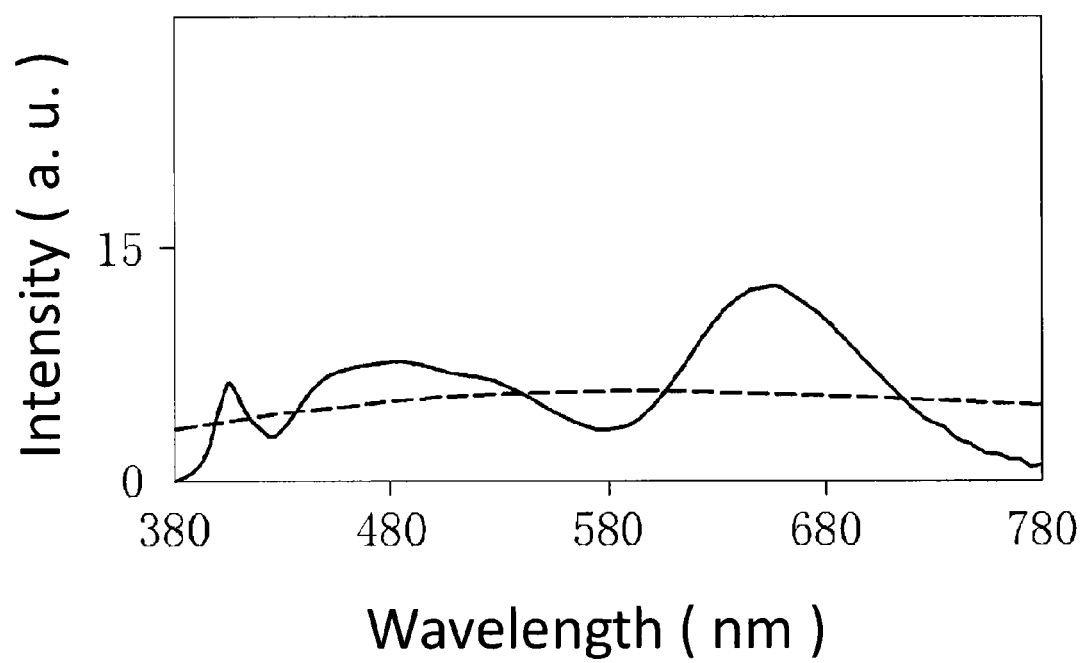
FIG. 12 is a graph of an emission spectrum of a semiconductor light-emitting device according to a fourth example.

FIG. 11 is a graph showing a spectrum of synthetic light emitted by the semiconductor light-emitting device 1 according to the third example. In FIG. 11, a spectrum of the synthetic light emitted by the semiconductor light-emitting device 1 according to the third example is represented by a solid line and a spectrum of a reference light for color rendering evaluation corresponding to a correlated color temperature of the synthetic light is represented by a dotted line. FIG. 12 is a graph showing a spectrum of synthetic light emitted by the semiconductor light-emitting device 1 according to the fourth example. In FIG. 12, a spectrum of the synthetic light emitted by the semiconductor light-emitting device 1 according to the fourth example is represented by a solid line and a spectrum of a reference light for color rendering evaluation corresponding to a correlated color temperature of the synthetic light is represented by a dotted line.

FIG. 13 is a table showing measurement results of emission characteristics of the semiconductor light-emitting device 1 according to the third example and emission characteristics of the semiconductor light-emitting device 1 according to the fourth example. In addition, FIG. 13 shows a result regarding emission characteristics of a reference light at a correlated color temperature (3327 K) of light emitted by the semiconductor light-emitting device 1 according to the third example as a seventh reference example. Furthermore, FIG. 13 shows a result regarding emission characteristics of a reference light at a correlated color temperature (4865 K) of light emitted by the semiconductor light-emitting device 1 according to the fourth example as an eighth reference example.

Figure 14:
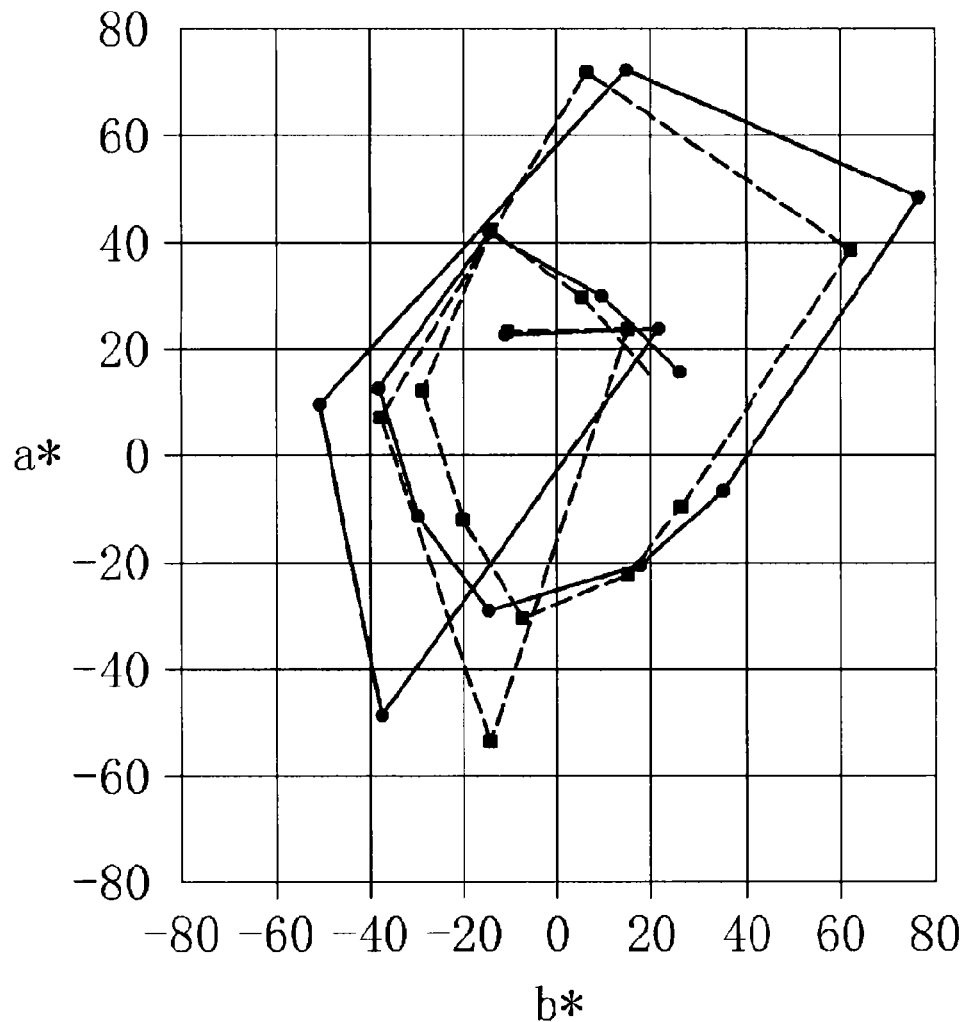
FIG. 14 is a graph showing emission characteristics of the semiconductor light-emitting device according to the third example and emission characteristics of a seventh reference example in a CIELab color space.
Figure 15:
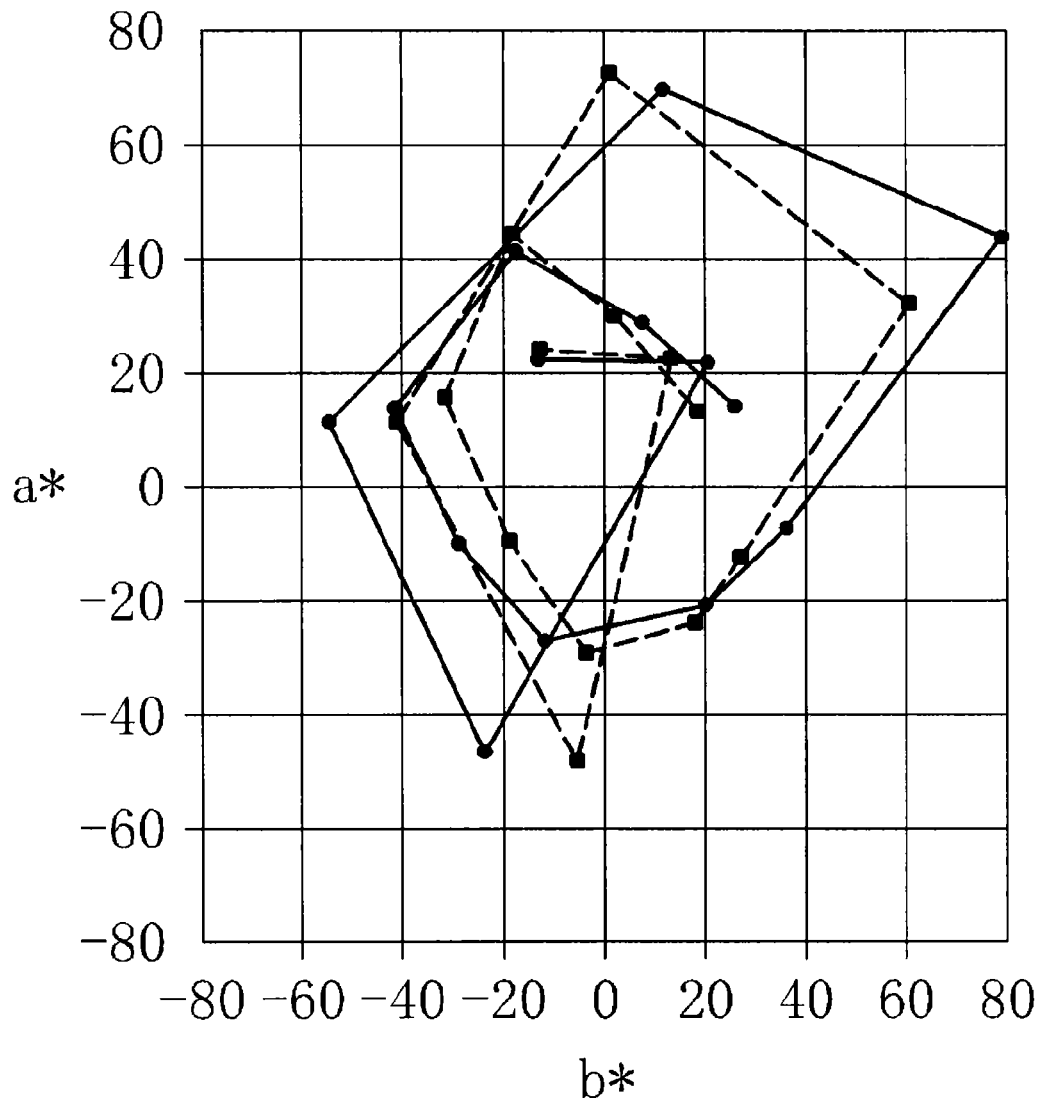
FIG. 15 is a graph showing emission characteristics of the semiconductor light-emitting device according to the fourth example and emission characteristics of an eighth reference example in a CIELab color space.

FIG. 14 is a graph showing emission characteristics of the semiconductor light-emitting device 1 according to the third example and emission characteristics of the seventh reference example in a CIELab color space. In FIG. 14, the emission characteristics of the semiconductor light-emitting device 1 according to the third example are indicated by a solid line and the emission characteristics of the seventh reference example are indicated by a dotted line. FIG. 15 is a graph showing emission characteristics of the semiconductor light-emitting device 1 according to the fourth example and emission characteristics of the eighth reference example in a CIELab color space. In FIG. 15, the emission characteristics of the semiconductor light-emitting device 1 according to the fourth example are indicated by a solid line and the emission characteristics of the eighth reference example are indicated by a dotted line.

As shown in FIGS. 14 and 15, it is found that both the semiconductor light-emitting device 1 according to the third example and the semiconductor light-emitting device 1 according to the fourth example exhibit favorable results for all of C*ab regarding a test color with a special color rendering index of R9, C*ab regarding a test color with a special color rendering index of R11, C*ab regarding a test color with a special color rendering index of R12, and C*ab of respective test colors with special color rendering indices of R1 to R14 in a similar manner to the experimental results of the semiconductor light-emitting device 1 according to the first example and the semiconductor light-emitting device 1 according to the second example shown in FIGS. 4 and 5.

According to the first embodiment of the present invention, the semiconductor light-emitting device 1 is capable of emitting light with high chroma. Specifically, a semiconductor light-emitting device configured as described above is capable of emitting light such that an average value of C*ab values of respective test colors with special color rendering indices of R1 to R14 is greater than an average value of C*ab values of respective test colors with special color rendering indices of R1 to R14 based on a reference light for color rendering evaluation, a C*ab value of a test color of R9 which is a special color rendering index used for evaluating vivid red is greater by 5 or more than a C*ab value of the test color of R9 based on a reference light for color rendering evaluation, and a C*ab value of a test color of R11 which is a special color rendering index used for evaluating vivid green is greater by 5 or more than a C*ab value of the test color of R11 based on a reference light for color rendering evaluation.

In addition, by setting the C*ab value of a test color of R9 to a value that is greater than the C*ab value of the test color of R9 based on a reference light for color rendering evaluation by 5 or more, preferably by 10 or more, more preferably by 15 or more, and even more preferably by 20 or more, the average value of C*ab values of respective test colors with special color rendering indices of R1 to R14 can be set greater than the average value of C*ab values of respective test colors with special color rendering indices of R1 to R14 based on a reference light for color rendering evaluation. Moreover, the average value of C*ab values of respective test colors with special color rendering indices of R1 to R14 can also be set greater than the average value of C*ab values of respective test colors with special color rendering indices of R1 to R14 based on a reference light for color rendering evaluation by setting the C*ab of a test color of R9 to a value that is 105% or more, preferably 110% or more, more preferably 120% or more, and even more preferably 125% or more of the C*ab value of the test color of R9 based on a reference light for color rendering evaluation. Furthermore, by setting the C*ab value of a test color of R11 to a value that is greater than the C*ab value of the test color of R11 based on a reference light for color rendering evaluation by 5 or more and preferably by 10 or more, the average value of C*ab values of respective test colors with special color rendering indices of R1 to R14 can be set greater than the average value of C*ab values of respective test colors with special color rendering indices of R1 to R14 based on a reference light for color rendering evaluation.

Moreover, the average value of C*ab values of respective test colors with special color rendering indices of R1 to R14 can also be set greater than the average value of C*ab values of respective test colors with special color rendering indices of R1 to R14 based on a reference light for color rendering evaluation by setting the C*ab of a test color of R11 to a value that is 110% or more and preferably 125% or more of the C*ab value of the test color of R11 based on a reference light for color rendering evaluation.

In addition, by setting the C*ab value of a test color of R9 to a value that is greater than the C*ab value of the test color of R9 based on a reference light for color rendering evaluation by 5 or more, preferably by 10 or more, more preferably by 15 or more, and even more preferably by 20 or more, the semiconductor light-emitting device 1 can be more preferably used for meat illumination, raw meat illumination, and red-fleshed fish illumination. Moreover, the semiconductor light-emitting device 1 can also be more preferably used for meat illumination, raw meat illumination, and red-fleshed fish illumination by setting the C*ab of a test color of R9 to a value that is 105% or more, preferably 110% or more, more preferably 120% or more, and even more preferably 125% or more of the C*ab value of the test color of R9 based on a reference light for color rendering evaluation.

By setting the C*ab value of a test color of R11 to a value that is greater than the C*ab value of the test color of R11 based on a reference light for color rendering evaluation by 5 or more and preferably by 10 or more, the semiconductor light-emitting device 1 can be more preferably used for vegetable illumination and dark-green vegetable illumination. Moreover, the semiconductor light-emitting device 1 can also be more preferably used for vegetable illumination and dark-green vegetable illumination by setting the C*ab of a test color of R11 to a value that is 110% or more and preferably 125% or more of the C*ab value of the test color of R11 based on a reference light for color rendering evaluation.

In addition, since the semiconductor light-emitting device 1 according to the first embodiment uses a semiconductor light-emitting element which does not have a mercury emission line as an excitation source of the phosphors, the semiconductor light-emitting device 1 according to the first embodiment is able to vividly present any monochrome irradiated subject regardless of reflection characteristics of the monochrome irradiated subject.

According to the second embodiment of the present invention, the semiconductor light-emitting device 1 is capable of emitting light such that an average value of C*ab values of respective test colors with special color rendering indices of R1 to R14 is greater than an average value of C*ab values of respective test colors with special color rendering indices of R1 to R14 based on a reference light for color rendering evaluation, a C*ab value of a test color of R9 which is a special color rendering index used for evaluating vivid red is greater by 5 or more than a C*ab value of the test color of R9 based on a reference light for color rendering evaluation, and a C*ab value of a test color of R11 which is a special color rendering index used for evaluating vivid green is greater by 5 or more than a C*ab value of the test color of R11 based on a reference light for color rendering evaluation.

By setting the C*ab value of a test color of R9 to a value that is greater than the C*ab value of the test color of R9 based on a reference light for color rendering evaluation by 5 or more, preferably by 10 or more, more preferably by 15 or more, and even more preferably by 20 or more, the average value of C*ab values of respective test colors with special color rendering indices of R1 to R14 can be set greater than the average value of C*ab values of respective test colors with special color rendering indices of R1 to R14 based on a reference light for color rendering evaluation. Moreover, the average value of C*ab values of respective test colors with special color rendering indices of R1 to R14 can also be set greater than the average value of C*ab values of respective test colors with special color rendering indices of R1 to R14 based on a reference light for color rendering evaluation by setting the C*ab of a test color of R9 to a value that is 105% or more, preferably 110% or more, more preferably 120% or more, and even more preferably 125% or more of the C*ab value of the test color of R9 based on a reference light for color rendering evaluation.

Furthermore, by setting the C*ab value of a test color of R11 to a value that is greater than the C*ab value of the test color of R11 based on a reference light for color rendering evaluation by 5 or more and preferably by 10 or more, the average value of C*ab values of respective test colors with special color rendering indices of R1 to R14 can be set greater than the average value of C*ab values of respective test colors with special color rendering indices of R1 to R14 based on a reference light for color rendering evaluation. Moreover, the average value of C*ab values of respective test colors with special color rendering indices of R1 to R14 can also be set greater than the average value of C*ab values of respective test colors with special color rendering indices of R1 to R14 based on a reference light for color rendering evaluation by setting the C*ab of a test color of R11 to a value that is 110% or more and preferably 125% or more of the C*ab value of the test color of R11 based on a reference light for color rendering evaluation.

By setting the C*ab value of a test color of R9 to a value that is greater than the C*ab value of the test color of R9 based on a reference light for color rendering evaluation by 5 or more, preferably by 10 or more, more preferably by 15 or more, and even more preferably by 20 or more, the semiconductor light-emitting device 1 can be more preferably used for meat illumination, raw meat illumination, and red-fleshed fish illumination. Moreover, the semiconductor light-emitting device 1 can also be more preferably used for meat illumination, raw meat illumination, and red-fleshed fish illumination by setting the C*ab of a test color of R9 to a value that is 105% or more, preferably 110% or more, more preferably 120% or more, and even more preferably 125% or more of the C*ab value of the test color of R9 based on a reference light for color rendering evaluation.

In addition, by setting the C*ab value of a test color of R11 to a value that is greater than the C*ab value of the test color of R11 based on a reference light for color rendering evaluation by 5 or more and preferably by 10 or more, the semiconductor light-emitting device 1 can be more preferably used for vegetable illumination and dark-green vegetable illumination. Moreover, the semiconductor light-emitting device 1 can also be more preferably used for vegetable illumination and dark-green vegetable illumination by setting the C*ab of a test color of R11 to a value that is 110% or more and preferably 125% or more of the C*ab value of the test color of R11 based on a reference light for color rendering evaluation.

Since the semiconductor light-emitting device 1 according to the second embodiment contains a broadband green phosphor and a broadband red phosphor and therefore has sufficient emission intensity across all wavelength regions of visible light and, at the same time, uses a semiconductor light-emitting element which does not have a mercury emission line as an excitation source of the phosphors, the semiconductor light-emitting device 1 according to the second embodiment is able to vividly present any monochrome irradiated subject regardless of reflection characteristics of the monochrome irradiated subject.

Since the semiconductor light-emitting devices 1 according to the respective embodiments of the present invention are configured so as to emit light having a value of intensity of light with a wavelength of 500 nm in a spectrum of light normalized with respect to luminous flux which is 15% or more and 200% or less of a value of intensity of light with a wavelength of 500 nm in a spectrum of reference light normalized with respect to luminous flux for color rendering evaluation, light can be emitted such that a C*ab value regarding R12 that is a special color rendering index used for evaluating vivid blue is greater by 2 or more than a C*ab value regarding a test color with R12 based on a reference light for color rendering evaluation.

In addition, by setting the C*ab value of a test color of R12 to a value that is greater than the C*ab value of the test color of R12 based on a reference light for color rendering evaluation by 2 or more and preferably by 5 or more, an average value of C*ab values of respective test colors with special color rendering indices of R1 to R14 can be set greater than an average value of C*ab values of respective test colors with special color rendering indices of R1 to R14 based on a reference light for color rendering evaluation.

Moreover, the average value of C*ab values of respective test colors with special color rendering indices of R1 to R14 can also be set greater than the average value of C*ab values of respective test colors with special color rendering indices of R1 to R14 based on a reference light for color rendering evaluation by setting the C*ab of a test color of R12 to a value that is 103% or more and preferably 108% or more of the C*ab value of the test color of R12 based on a reference light for color rendering evaluation. In addition, by setting the C*ab value of a test color of R12 to a value that is greater than the C*ab value of the test color of R12 based on a reference light for color rendering evaluation by 2 or more and preferably by 5 or more, the semiconductor light-emitting device 1 can be more preferably used for fresh fish illumination and blue-skin fish illumination. Moreover, the semiconductor light-emitting device 1 can also be more preferably used for fresh fish illumination and blue-skin fish illumination by setting the C*ab of a test color of R12 to a value that is 103% or more and preferably 108% or more of the C*ab value of the test color of R12 based on a reference light for color rendering evaluation.

While the semiconductor light-emitting device 1 according to the first example and the semiconductor light-emitting device 1 according to the second example of the present invention can be used for general-purpose illumination, since the average value of C*ab values of respective test colors with special color rendering indices of R1 to R14 is greater than the average value of C*ab values of respective test colors with special color rendering indices of R1 to R14 based on a reference light for color rendering evaluation and irradiated subjects can be presented more vividly, the semiconductor light-emitting device 1 according to the first example and the semiconductor light-emitting device 1 according to the second example of the present invention can be more preferably used for exhibit illumination.

In addition, since the semiconductor light-emitting device 1 according to the first example and the semiconductor light-emitting device 1 according to the second example of the present invention are capable of emitting light such that a C*ab value of a test color of R9 which is a special color rendering index used for evaluating vivid red is greater by 5 or more than a C*ab value of the test color of R9 based on a reference light for color rendering evaluation, the semiconductor light-emitting device 1 according to the first example and the semiconductor light-emitting device 1 according to the second example of the present invention can be more preferably used for meat illumination, raw meat illumination, and red-fleshed fish illumination.

Furthermore, since the semiconductor light-emitting device 1 according to the first example and the semiconductor light-emitting device 1 according to the second example of the present invention are capable of emitting light such that a C*ab value of a test color of R11 which is a special color rendering index used for evaluating vivid green is greater by 5 or more than a C*ab value of the test color of R11 based on a reference light for color rendering evaluation, the semiconductor light-emitting device 1 according to the first example and the semiconductor light-emitting device 1 according to the second example of the present invention can be more preferably used for vegetable illumination and dark-green vegetable illumination.

Moreover, since the semiconductor light-emitting device 1 according to the first example and the semiconductor light-emitting device 1 according to the second example of the present invention are capable of emitting light such that a C*ab value of a test color of R12 which is a special color rendering index used for evaluating vivid blue is greater by 2 or more than a C*ab value of the test color of R12 based on a reference light for color rendering evaluation, the semiconductor light-emitting device 1 according to the first example and the semiconductor light-emitting device 1 according to the second example of the present invention can be more preferably used for fresh fish illumination and blue-skin fish illumination.

Figure 16:
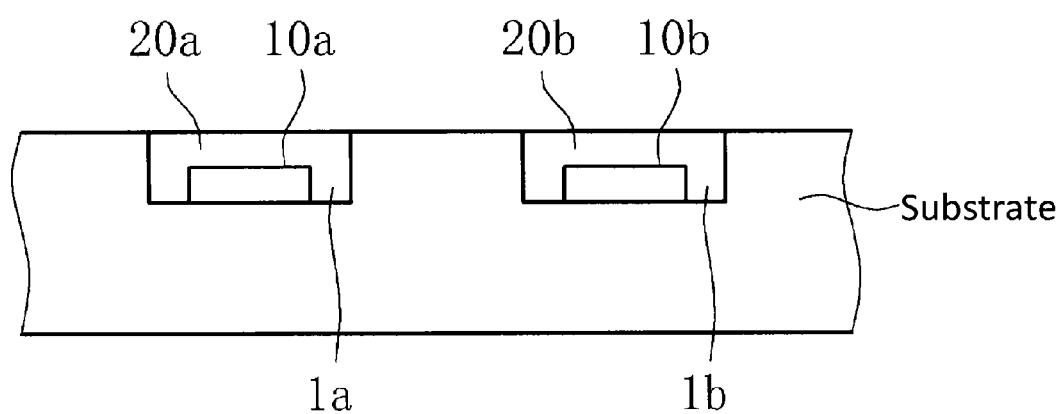
FIG. 16 is an explanatory diagram showing an example of a semiconductor light-emitting system which combines semiconductor light-emitting devices.

The semiconductor light-emitting devices 1 of the respective examples according to the respective embodiments described above may be combined with one another. FIG. 16 is an explanatory diagram showing an example of a semiconductor light-emitting system which combines semiconductor light-emitting devices 1. In the example shown in FIG. 16, a semiconductor light-emitting device 1*a* and a semiconductor light-emitting device 1*b* with different emission spectra are installed side by side.

The semiconductor light-emitting device 1*a* includes a LED chip 10*a* and a phosphor 20*a*.

The semiconductor light-emitting device 1*b* includes a LED chip 10*b* and a phosphor 20*b*.

When the emission spectrum of the semiconductor light-emitting device 1*a* shown in FIG. 16 is similar to the emission spectrum of the semiconductor light-emitting device 1 according to the first example and the emission spectrum of the semiconductor light-emitting device 1b shown in FIG. 16 is similar to the emission spectrum of the semiconductor light-emitting device 1 according to the second example, for example, by controlling amounts of current flowing through the respective LED chips, intensity of light emitted by the semiconductor light-emitting device 1a and intensity of light emitted by the semiconductor light-emitting device 1b can be adjusted and a semiconductor light-emitting system can be realized which enables chroma adjustment. Adjusting the intensity of light emitted by the semiconductor light-emitting device 1a and the intensity of light emitted by the semiconductor light-emitting device 1b means to adjust a mixing ratio of the emission spectrum of the semiconductor light-emitting device 1 according to the first example and the emission spectrum of the semiconductor light-emitting device 1 according to the second example. Therefore, light emitted by the semiconductor light-emitting system can be adjusted by adjusting a ratio of the intensity of light emitted by the semiconductor light-emitting device 1a and the intensity of light emitted by the semiconductor light-emitting device 1b as shown in FIG. 5.

The semiconductor light-emitting system desirably uses a combination of the semiconductor light-emitting device 1a and the semiconductor light-emitting device 1b such that a difference between average values of C*ab values regarding test colors of R1 to R14 of the respective light-emitting devices is 0.5 or more, preferably 1 or more, more preferably 2 or more, even more preferably 5 or more, and particularly preferably 10 or more. In addition, the semiconductor light-emitting system may use a combination of the semiconductor light-emitting device 1a and the semiconductor light-emitting device 1b such that a difference between C*ab values regarding a test color of R9 of the respective light-emitting devices is 0.5 or more, preferably 1 or more, more preferably 2 or more, even more preferably 5 or more, and particularly preferably 10 or more. When such a combination is used, a semiconductor light-emitting system which enables chroma adjustment regarding vivid red can be realized. Furthermore, the semiconductor light-emitting system may use a combination of the semiconductor light-emitting device 1a and the semiconductor light-emitting device 1b such that a difference between C*ab values regarding a test color of R11 is 0.5 or more, preferably 1 or more, more preferably 2 or more, even more preferably 5 or more, and particularly preferably 10 or more. When such a combination is used, a semiconductor light-emitting system which enables chroma adjustment regarding vivid green can be realized. Moreover, the semiconductor light-emitting system may use a combination of the semiconductor light-emitting device 1a and the semiconductor light-emitting device 1b such that a difference between C*ab values regarding a test color of R12 is 0.5 or more, preferably 1 or more, more preferably 2 or more, even more preferably 5 or more, and particularly preferably 10 or more. When such a combination is used, a semiconductor light-emitting system which enables chroma adjustment regarding vivid blue can be realized.

In addition, with the semiconductor light-emitting system, if light emitted by the semiconductor light-emitting device 1a and light emitted by the semiconductor light-emitting device 1b share the same chromaticity or color temperature, an adjustment for changing only chroma of a synthetic light emitted by the semiconductor light-emitting system can be performed while keeping the chromaticity or color temperature constant.

Moreover, in the semiconductor light-emitting system, the semiconductor light-emitting device 1a and the semiconductor light-emitting device 1b may respectively satisfy any of conditions of the first embodiment (the conditions listed in (semiconductor light-emitting device 1 according to first embodiment) described above) and conditions of the second embodiment (the conditions listed in (semiconductor light-emitting device 1 according to second embodiment) described above), only the conditions of the first embodiment, and only the conditions of the second embodiment. Alternatively, as long as synthetic light emitted by the semiconductor light-emitting system satisfies the conditions of the first embodiment and/or the conditions of the second embodiment, the semiconductor light-emitting device 1a and the semiconductor light-emitting device 1b need not satisfy either of the conditions. When one semiconductor light-emitting device of the semiconductor light-emitting device 1a and the semiconductor light-emitting device 1b satisfies either of the conditions, chroma of light emitted by the semiconductor light-emitting system can be increased by increasing the ratio of light emitted by the one semiconductor light-emitting device.

In the semiconductor light-emitting system, a semiconductor light-emitting device which emits light with high chroma may be used as one of the semiconductor light-emitting device 1a and the semiconductor light-emitting device 1b, and a semiconductor light-emitting device with an emission spectrum having superior color rendering properties regarding all colors in the visible light region may be used as the other semiconductor light-emitting device. Specifically, for example, a configuration may be adopted in which the semiconductor light-emitting device 1a is a semiconductor light-emitting device satisfying the conditions of the first embodiment and/or the conditions of the second embodiment and the semiconductor light-emitting device 1b is a semiconductor light-emitting device that emits light with an average color rendering index Ra of 80 or more and preferably 90 or more. Such a configuration enables color rendering properties and chroma of all colors in the visible light region to be adjusted by respectively adjusting emission intensities of the semiconductor light-emitting device 1a and the semiconductor light-emitting device 1b. Moreover, the semiconductor light-emitting device 1b may be a semiconductor light-emitting device that emits light in which special color rendering indices of R9, R11, and R12 are respectively 80 or more and preferably 90 or more.

In the semiconductor light-emitting system, the semiconductor light-emitting device 1a and the semiconductor light-emitting device 1b may be semiconductor light-emitting devices which respectively satisfy the conditions of the first embodiment and/or conditions of the second embodiment and which have correlated color temperatures that differ from one another. Such a configuration enables only the correlated color temperature of a synthetic light emitted by the semiconductor light-emitting system to be adjusted while keeping chroma constant. Moreover, a difference between a correlated color temperature of light emitted by one of the semiconductor light-emitting devices and a correlated color temperature of light emitted by the other semiconductor light-emitting device is preferably 2000 K or more, more preferably 3000 K or more, and particularly preferably 3500 K or more. Specifically, for example, the correlated color temperature of light emitted by one of the semiconductor light-emitting devices is set to 2700 K and the correlated color temperature of light emitted by the other semiconductor light-emitting device is set to 6700 K.

Figure 17:
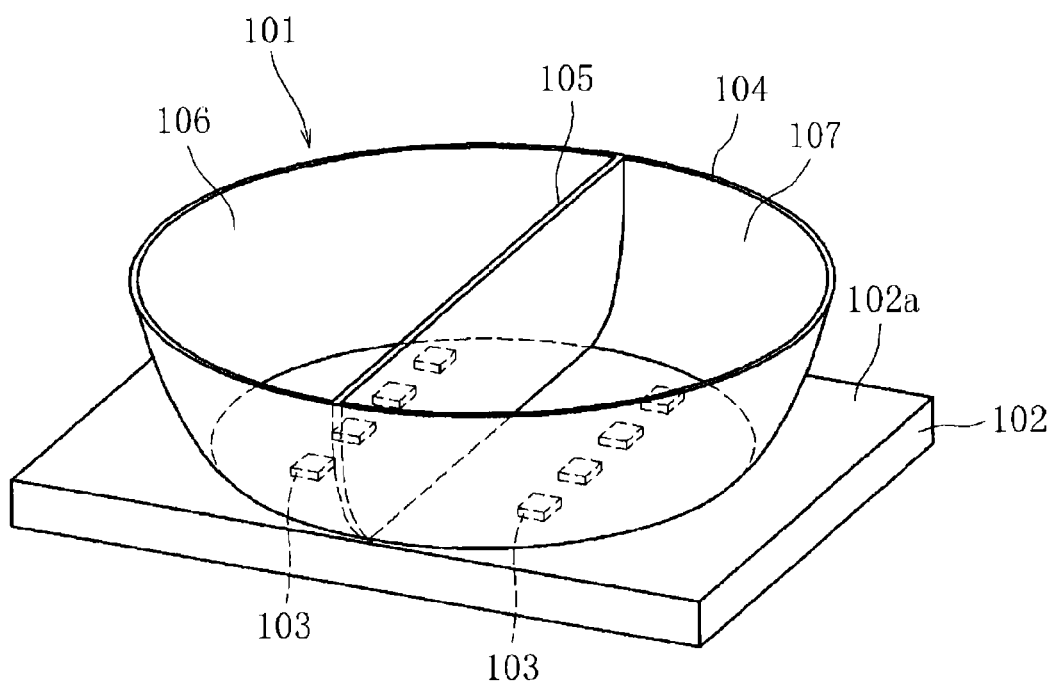
FIG. 17 is an explanatory diagram showing another example of a semiconductor light-emitting system comprising a plurality of semiconductor light-emitting devices.

FIG. 17 shows another example of a semiconductor light-emitting system comprising the semiconductor light-emitting device 1a and the semiconductor light-emitting device 1b similar to that shown in FIG. 16. In the example shown in FIG.

17, a semiconductor light-emitting system 101 comprises LED chips 103 mounted in two rows, each row consisting of four LED chips 103, on a chip mounting surface 102a of an alumina ceramic wiring substrate 102 with superior electrical insulation properties and good heat radiation ability.

An annular reflector (wall member) 104 in the form of a truncated cone is also provided so as to surround those LED chips 103 on the chip mounting surface 102a of the wiring substrate 102.

A partition member 105 divides the inside of the reflector 104 into a first region 106 and a second region 107. Both the first region 106 and the second region 107 are loaded with fillers respectively mixed with phosphors. Specifically, the first region 106 is loaded with a phosphor in accordance with characteristics of the desired one semiconductor light-emitting device 1a (for example, the phosphor according to the first example), and the second region 107 is loaded with a phosphor in accordance with characteristics of the desired other semiconductor light-emitting device 1b (for example, the phosphor according to the second example).

Therefore, in the first region 106, the semiconductor light-emitting device 1a is constituted by the LED chips 103 and the phosphor loaded into the first region 106, and in the second region 107, the semiconductor light-emitting device 1b is constituted by the LED chips 103 and the phosphor loaded into the second region 107.

The reflector 104 and the partition member 105 can be formed from a resin, a metal or a ceramic and are fixed to the wiring substrate 102 with an adhesive or the like. When an electrically conductive material is used for the reflector 104 and the partition member 105, a treatment should be performed to ensure electric insulation from the wiring pattern.

Moreover, the number of LED chips 103 shown in FIG. 17 is merely an example and can be increased or reduced as necessary. For example, a single LED chip 103 can be respectively placed in the first region 106 and the second region 107, or the numbers of LED chips 103 in the respective regions may differ from each other. Further, the material of the wiring substrate 102 is not limited to alumina ceramic and a variety of other materials can be used. For example, a material selected from ceramics, resins, glass epoxy, and composite resins in which a filler is contained in a resin may be used. From the standpoint of improving the light reflection ability on the chip mounting surface 102a of the wiring substrate 102 and increasing the emission efficiency of the semiconductor light-emitting system, it is preferred that a silicon resin including a white pigment such as an alumina powder, a silica powder, magnesium oxide, and titanium oxide be used. Meanwhile, by using a metal substrate such as a copper substrate or an aluminum substrate, it is possible to improve heat radiation ability. However, in this case, an electric insulator should be interposed between the wiring board and the wiring pattern formed thereon.

The shapes of the above-described reflector 104 and partition member 105 are also exemplary and can be variously changed, as necessary.

For example, instead of the pre-molded reflector 104 and partition member 105, it is possible to form an annular wall section (wall member) corresponding to the reflector 104 on the chip mounting surface 102a of the wiring substrate 102 by using a dispenser or the like, and then form a partition wall (partition member) corresponding to the partition member 105. In this case, for example, a paste-like thermosetting resin material or a UV-curable resin material can be used for the annular wall section and partition wall section, and a silicone resin including an inorganic filler is preferred.

With a configuration such as that shown in FIG. 17, amounts of current flowing through the semiconductor light-emitting device 1a installed in the first region 106 and the semiconductor light-emitting device 1b installed in the second region 107 can be controlled based on an emission spectrum of the semiconductor light-emitting device 1a and an emission spectrum of the semiconductor light-emitting device 1b to adjust characteristics (chroma, color rendering properties, correlated color temperature, and the like) of light emitted by the semiconductor light-emitting system.

Moreover, in the configuration shown in FIG. 17, phosphor may be applied to a transparent plate material and the phosphor-coated plate material may be arranged above the LED chips 103 instead of loading phosphors into the first region 106 and the second region 107.

The invention has been described in detail and with reference to specific embodiments thereof, it will be apparent to one skilled in the art that various changes and modifications can be made therein without departing from the spirit and scope thereof.

EXPLANATION OF REFERENCE NUMERALS 1, 1a, 1b: semiconductor light-emitting device
10, 10a, 10b, 103: LED chip
20, 20a, 20b: phosphor
101: semiconductor light-emitting system
102: wiring substrate
102a: chip mounting surface
104: reflector
105: partition member
106: first region
107: second region

The invention claimed is:
1. A semiconductor light-emitting device comprising:
a semiconductor light-emitting element; and
a phosphor which uses the semiconductor light-emitting element as an excitation source to emit light, wherein
the phosphor contains at least a broadband green phosphor and a broadband red phosphor;
the broadband red phosphor comprises at least one type selected from the group consisting of $CaAlSi(N,O)_3$:Eu, $(Sr,Ca)AlSi(N,O)_3$:Eu and $(Ca,Sr,Ba)AlSi(N,O)_3$:Eu;
the broadband red phosphor has an emission peak wavelength within a wavelength range that is 650 nm or more and 680 nm or less;
the semiconductor light-emitting device emits light with a chromaticity coordinate in an XY chromaticity diagram of a CIE (1931) XYZ color system whose value of a deviation duv from a black-body radiation trajectory curve is −0.03 or more and −0.005 or less, and
a value of intensity of light with a wavelength of 660 nm in a spectrum of light normalized with respect to luminous flux emitted from the semiconductor light-emitting device is 170% or more and 300% or less of a value of intensity of light with a wavelength of 660 nm in a spectrum of reference light normalized with respect to luminous flux for color rendering evaluation.

2. The semiconductor light-emitting device according to claim 1, wherein a value of intensity of light with a wavelength of 500 nm in a spectrum of light normalized with respect to luminous flux emitted from the semiconductor light-emitting device is 15% or more and 200% or less of a value of intensity of light with a wavelength of 500 nm in a spectrum of reference light normalized with respect to luminous flux for color rendering evaluation.

3. A semiconductor light-emitting device comprising:
a semiconductor light-emitting element; and
a phosphor which uses the semiconductor light-emitting element as an excitation source to emit light, wherein
the phosphor contains at least a green phosphor and a red phosphor;
the red phosphor comprises at least one type selected from the group consisting of $CaAlSi(N,O)_3$:Eu, $(Sr,Ca)AlSi(N,O)_3$:Eu and $(Ca,Sr,Ba)AlSi(N,O)_3$:Eu;
an emission peak wavelength of the red phosphor is 650 nm or more and 680 nm or less;
the semiconductor light-emitting device emits light with a chromaticity coordinate in an XY chromaticity diagram of a CIE (1931) XYZ color system whose value of a deviation duv from a black-body radiation trajectory curve is −0.03 or more and −0.005 or less;
a value of an energy area of light with a wavelength of 600 nm or more and 780 nm or less in a spectrum of light normalized with respect to luminous flux emitted from the semiconductor light-emitting device is 85% or more and 150% or less of a value of an energy area of light with a wavelength of 600 nm or more and 780 nm or less in a spectrum of reference light normalized with respect to luminous flux for color rendering evaluation, and
a value of intensity of light with a wavelength of 500 nm in a spectrum of light normalized with respect to luminous flux emitted from the semiconductor light-emitting device is 110% or more and 200% or less of a value of intensity of light with a wavelength 500 nm in a spectrum of reference light normalized with respect to luminous flux for color rendering evaluation.

4. The semiconductor light-emitting device according to claim 1, wherein the semiconductor light-emitting device emits light with a correlated color temperature of 2500 K or more and 7000 K or less.

5. The semiconductor light-emitting device according to claim 1, wherein the phosphor contains a blue phosphor.

6. The semiconductor light-emitting device according to claim 5, wherein an emission peak wavelength of the blue phosphor is 440 nm or more and 500 nm or less.

7. The semiconductor light-emitting device according to claim 5, wherein a half-width of the blue phosphor is 20 nm or more and 90 nm or less.

8. The semiconductor light-emitting device according to claim 5, wherein the blue phosphor is $(Sr,Ba,Ca)_5(PO_4)_3Cl$:Eu, or $BaMgAl_{10}O_{17}$:Eu.

9. The semiconductor light-emitting device according to claim 1, wherein an emission peak wavelength of the green phosphor is 510 nm or more and 550 nm or less.

10. The semiconductor light-emitting device according to claim 1, wherein a half-width of the green phosphor is 60 nm or more and 140 nm or less.

11. The semiconductor light-emitting device according to claim 1, wherein the green phosphor is at least one type selected from the group consisting of $(Sr,Ba)_2SiO_4$:Eu, β-Sialon, and $(Ba,Sr)_3Si_6O_{12}N_2$:Eu.

12. The semiconductor light-emitting device according to claim 1, wherein the red phosphor is $(Sr,Ca)AlSi(N,O)_3$:Eu.

13. The semiconductor light-emitting device according to claim 1, wherein light emitted by the semiconductor light-emitting device has a C*ab value regarding a test color with a special color rendering index of R9 that is 105% or more of a C*ab value regarding a test color with a special color rendering index of R9 based on a reference light for color rendering evaluation.

14. The semiconductor light-emitting device according to claim 1, wherein light emitted by the semiconductor light-emitting device has a C*ab value regarding a test color with a special color rendering index of R11 that is 110% or more of a C*ab value regarding a test color with a special color rendering index of R11 based on a reference light for color rendering evaluation.

15. The semiconductor light-emitting device according to claim 1, wherein light emitted by the semiconductor light-emitting device has a C*ab value regarding a test color with a special color rendering index of R12 that is 103% or more of a C*ab value regarding a test color with a special color rendering index of R12 based on a reference light for color rendering evaluation.

16. An exhibit-irradiating illumination device comprising the semiconductor light-emitting device according to claim 1.

17. A meat-irradiating illumination device comprising the semiconductor light-emitting device according to claim 1.

18. A vegetable-irradiating illumination device comprising the semiconductor light-emitting device according to claim 1.

19. A fresh fish-irradiating illumination device comprising the semiconductor light-emitting device according to claim 1.

20. A general-purpose illumination device comprising the semiconductor light-emitting device according to claim 1.

21. A semiconductor light-emitting system comprising the semiconductor light-emitting device according to claim 1 as a first semiconductor light-emitting device, and a second semiconductor light-emitting device which emits light such that a difference between an average value of C*ab values regarding respective test colors with special color rendering indices of R1 to R14 and a corresponding average value of the first semiconductor light-emitting device is 0.5 or more.

22. A semiconductor light-emitting system comprising:
the semiconductor light-emitting device according to claim 1 as a first semiconductor light-emitting device; and
a second semiconductor light-emitting device which emits light such that a difference between a C*ab value regarding a test color with a special color rendering index of R9 and a corresponding value of the first semiconductor light-emitting device is 0.5 or more.

23. A semiconductor light-emitting system comprising:
the semiconductor light-emitting device according to claim 1 as a first semiconductor light-emitting device; and
a second semiconductor light-emitting device which emits light such that a difference between a C*ab value regarding a test color with a special color rendering index of R11 and a corresponding value of the first semiconductor light-emitting device is 0.5 or more.

24. A semiconductor light-emitting system comprising:
the semiconductor light-emitting device according to claim 1 as a first semiconductor light-emitting device; and
a second semiconductor light-emitting device which emits light such that a difference between a C*ab value regarding a test color with a special color rendering index of R12 and a corresponding value of the first semiconductor light-emitting device is 0.5 or more.

25. A semiconductor light-emitting system comprising:
the semiconductor light-emitting device according to claim 1 as a first semiconductor light-emitting device; and
a second semiconductor light-emitting device which emits light with a correlated color temperature that differs from a correlated color temperature of light emitted by the first semiconductor light-emitting device.

26. A semiconductor light-emitting system comprising:
the semiconductor light-emitting device according to claim 1 as a first semiconductor light-emitting device; and
a second semiconductor light-emitting device which emits light with a value of an average color rendering index Ra of 80 or more.

27. The semiconductor light-emitting device according to claim 1, wherein the broadband green phosphor comprises at least one type selected from the group consisting of β-sialon, $(Ba,Sr)_3Si_6O_{12}N_2$:Eu and $(Y,Lu)_3(Al,Ga)_5O_{12}$:Ce.

* * * * *